(12) United States Patent
Iwatsu et al.

(10) Patent No.: US 10,428,438 B2
(45) Date of Patent: Oct. 1, 2019

(54) SUBSTRATE PROCESSING METHOD AND TEMPLATE

(71) Applicant: TOKYO ELECTRON LIMITED, Tokyo (JP)

(72) Inventors: Haruo Iwatsu, Kumamoto (JP); Tomohisa Hoshino, Yamanashi (JP); Toshiyuki Matsumoto, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 772 days.

(21) Appl. No.: 14/892,236

(22) PCT Filed: May 12, 2014

(86) PCT No.: PCT/JP2014/062584
§ 371 (c)(1),
(2) Date: Nov. 19, 2015

(87) PCT Pub. No.: WO2014/188897
PCT Pub. Date: Nov. 27, 2014

(65) Prior Publication Data
US 2016/0108538 A1 Apr. 21, 2016

(30) Foreign Application Priority Data
May 20, 2013 (JP) .................... 2013-106074

(51) Int. Cl.
*C25D 17/10* (2006.01)
*C25D 17/00* (2006.01)
(Continued)

(52) U.S. Cl.
CPC ............ *C25D 17/001* (2013.01); *C25D 5/02* (2013.01); *C25D 7/12* (2013.01); *C25D 17/008* (2013.01);
(Continued)

(58) Field of Classification Search
None
See application file for complete search history.

(56) References Cited

U.S. PATENT DOCUMENTS 6,773,570 B2 * 8/2004 Economikos ............ C25D 5/48
204/212
7,435,323 B2 * 10/2008 Basol .................. H01L 21/2885
205/123
(Continued)

FOREIGN PATENT DOCUMENTS

JP 2012-132058 A 7/2012

OTHER PUBLICATIONS

International Search Report dated Aug. 12, 2014 in PCT/JP2014/062584.

*Primary Examiner* — Stefanie S Wittenberg
(74) *Attorney, Agent, or Firm* — Rothwell, Figg, Ernst & Manbeck, P.C.

(57) ABSTRACT

A substrate processing method of performing a predetermined processing by supplying a processing liquid to a processing region of a substrate and using processing target ions in the processing liquid, includes: arranging a template to face the substrate, the template including a passage configured to distribute the processing liquid, a direct electrode, and an indirect electrode, and the substrate including a counter electrode, which matches with the direct electrode, installed in the processing region; supplying the processing liquid to the processing region through the passage; and performing the predetermined processing on the substrate by applying a voltage to the indirect electrode to cause the processing target ions to migrate to the counter electrode side while applying a voltage between the direct electrode and the counter electrode to oxidize or reduce the processing target ions that have migrated to the counter electrode side.

32 Claims, 21 Drawing Sheets

(51) Int. Cl.
*C25D 5/02* (2006.01)
*C25F 3/02* (2006.01)
*H01L 21/768* (2006.01)
*H01L 21/288* (2006.01)
*C25D 7/12* (2006.01)
*C25D 21/12* (2006.01)

(52) U.S. Cl.
CPC ................ *C25D 17/10* (2013.01); *C25F 3/02* (2013.01); *H01L 21/2885* (2013.01); *H01L 21/76898* (2013.01); *C25D 21/12* (2013.01)

(56) References Cited

U.S. PATENT DOCUMENTS

| | | |
|---|---|---|
| 2008/0128019 A1 | 6/2008 | Lopatin et al. |
| 2009/0183992 A1* | 7/2009 | Fredenberg ......... B81C 99/0085 205/82 |

\* cited by examiner

SUBSTRATE PROCESSING METHOD AND TEMPLATE

CROSS REFERENCE TO RELATED APPLICATION

This application is a 35 U.S.C. 371 National Phase Entry Application from PCT/JP2014/062584, filed May 12, 2014, which claims priority to Japanese Patent Application No. 2013-106074, filed May 20, 2013, the disclosures of which are incorporated herein in their entirety by reference.

TECHNICAL FIELD

The present disclosure relates to a substrate processing method of performing a predetermined processing by supplying a processing liquid to a processing region of a substrate and using ions to be processed ("processing target ions") in the processing liquid, and a template for use in the substrate processing method.

BACKGROUND

Recently, high performance has been required for semiconductor devices, and the semiconductor devices have recently been advanced in high integration. Under such a situation, in a case where the semiconductor devices are manufactured by arranging a plurality of highly integrated semiconductor devices in a horizontal plane and connecting the semiconductor devices with wiring, it is concerned that the wiring length is increased and thus, the wiring resistance and the wiring delay are increased.

Accordingly, a three-dimensional (3D) integration technique for three-dimensionally stacking semiconductor devices has been proposed. In the 3D integration technique, a plurality of electrodes so-called through silicon vias (TSVs) having a minute diameter of, for example, 100 µm or less, are formed through a semiconductor wafer (hereinafter, referred to as a "wafer") which is thinned by polishing its rear surface and has a plurality of electronic circuits formed on its front surface. And, the vertically stacked wafers are electrically connected to each other through the through silicon vias.

Thus, when a through silicon via is formed in a through-hole, a plating metal is embedded in the through-hole by a plating method such as, for example, electrolytic plating. The electrolytic plating method is implemented in a plating apparatus described in, for example, Patent Document 1. The plating apparatus includes a plating bath that stores a plating liquid. The inside of the plating bath is partitioned by a regulation plate. An anode is arranged in one partitioned section, and a wafer is immersed in the other section so that a potential distribution between the anode and the wafer is adjusted by the regulation plate. After the wafer is immersed in the plating liquid within the plating bath, the anode is set to a positive pole and the wafer is set to a negative pole to apply voltage so that a current flows between the anode and the wafer. By the current, metal ions in the plating liquid are caused to migrate to the wafer side, and the metal ions are precipitated as a plating metal on the wafer side, so that the plating metal is embedded inside the through-hole.

PRIOR ART DOCUMENT

Patent Document

Patent Document 1: Japanese Patent Laid-Open Publication No. 2012-132058

DISCLOSURE OF THE INVENTION

Problems to be Solved

However, when the electrolytic plating method disclosed in Patent Document 1 is performed, the plating liquid is used in a large amount, which is more than the plating amount required to form the through silicon vias. Further, a large-scale mechanism is needed to stir and circulate the large amount of the plating liquid. In addition, since metal ions are caused to migrate to the wafer side in such a large amount of the plating liquid, the plating processing takes a lot of time.

Further, since the current flows between the anode and the wafer even when sufficient metal ions are not accumulated on the wafer side, the efficiency of the plating processing is poor. Further, since the plating processing is performed in a state where sufficient metal ions are not accumulated, the plating metal may be non-uniformly precipitated, for example, in the bottom portion of the through-hole. In such a case, the plating processing is not uniformly performed so that the through silicon vias cannot be properly formed.

The present disclosure has been made in consideration of such problems and an object of the present disclosure is to efficiently and properly perform a predetermined processing on a substrate by supplying a processing liquid to a processing region of the substrate and using processing target ions in the processing liquid.

Means to Solve the Problems

In order to achieve the object, the present disclosure provides a substrate processing method of performing a predetermined processing by supplying a processing liquid to a processing region of a substrate and using processing target ions in the processing liquid. The method includes: arranging a template to face the substrate, the template including a passage configured to distribute the processing liquid, a direct electrode, and an indirect electrode, and the substrate including a counter electrode, which matches with the direct electrode, installed in the processing region; supplying the processing liquid to the processing region through the passage; and performing the predetermined processing on the substrate by applying a voltage to the indirect electrode to cause the processing target ions to migrate to the counter electrode side while applying a voltage between the direct electrode and the counter electrode to oxidize or reduce the processing target ions that have migrated to the counter electrode side.

According to the present disclosure, in the performing of the predetermined processing, a voltage is applied to the indirect electrode while a voltage is applied between the direct electrode and the counter electrode. For example, in a case where the processing target ions are cations, when a voltage is applied to the indirect electrode to form an electrostatic field, negatively charged particles are collected on the indirect electrode and direct electrode sides, and the processing target ions are caused to migrate to the counter electrode side. Further, a voltage is applied in a state where the direct electrode is set to a positive pole and the counter electrode is set to a negative pole so that a current flows between the direct electrode and the counter electrode. Then, the charges of the processing target ions that have migrated to the counter electrode side as described above are exchanged so that the processing target ions are reduced.

Similarly, for example, in a case where the processing target ions are anions, when a voltage is applied to the indirect electrode to form an electrostatic field, the processing target ions are caused to migrate to the counter electrode side. Further, a voltage is applied in a state where the direct electrode is set to a negative pole and the counter electrode is set to a positive pole so that a current flows between the direct electrode and the counter electrode. Then, the charges of the processing target ions which have migrated to the counter electrode side as described above are exchanged so that the processing target ions are oxidized.

Thus, in the present disclosure, since the migration of the processing target ions by the indirect electrode and the oxidation or reduction (hereinafter, simply referred to as "redox" in some cases) of the processing target ions by the direct electrode and the counter electrode are individually conducted, the processing of the substrate may be efficiently performed in a short time. Further, since the redox of the processing target ions can be conducted in a state where sufficient processing target ions are accumulated on the counter electrode side, it is unnecessary to flow a useless current between the anode and the wafer as in the conventional electrolytic plating method, and the processing target ions may be efficiently oxidized or reduced. Moreover, since the processing target ions uniformly accumulated on the counter electrode side can be uniformly oxidized or reduced, the processing of the substrate may be uniformly performed. Further, since a large amount of plating liquid stored in the plating bath as in the conventional electrolytic plating method is not necessary and the plating liquid is supplied to the passage and the processing region only, the supply amount of the plating liquid may be suppressed in a small amount. Therefore, the migration distance of the processing target ions in the plating liquid is shorten so that the migration of the processing target ions may be achieved in a short time. Further, since there is no need for a large-scale mechanism for stirring and circulating a large amount of plating liquid as in the conventional technique, the apparatus configuration may be simplified.

According to another aspect, the present disclosure provides a template for use in performing a predetermined processing by supplying a processing liquid to a processing region of a substrate and using processing target ions in the processing liquid, the template including: a passage configured to distribute the processing liquid; an indirect electrode configured to cause the processing target ions to migrate to a counter electrode side when a voltage is applied; and a direct electrode configured to oxidize or reduce the processing target ions that have migrated to the counter electrode side by applying a voltage between the direct electrode and the counter electrode provided in the processing region.

Effect of the Invention

According to the present disclosure, a predetermined processing may be performed efficiently and properly on a substrate by supplying a processing liquid to a processing region of the substrate and using processing target ions in the processing liquid.

DETAILED DESCRIPTION TO EXECUTE THE INVENTION

Hereinafter, an exemplary embodiment of the present disclosure will be described. In the present exemplary embodiment, as a processing of a wafer serving as a substrate according to the present disclosure, a plating processing of forming a through silicon via in a through-hole formed in the wafer will be described together with a configuration of the wafer and a template used in the plating processing. Meanwhile, in drawings used in the following descriptions, the dimension of each component is intended to give priority to easy understanding of a technology and thus does not necessarily correspond to the actual dimension thereof.

Figure 1:
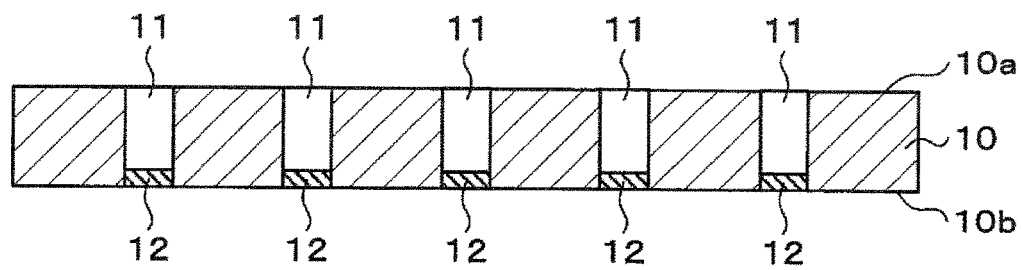
FIG. 1 is a vertical cross-sectional view illustrating a schematic configuration of a wafer.

First, descriptions will be made on a configuration of the wafer and the template used in the plating processing of the present exemplary embodiment. As illustrated in FIG. 1, the wafer 10 includes a plurality of through-holes 11 formed therethrough from a front surface 10a to a rear surface 10b thereof in a thickness direction. In the present exemplary embodiment, the inside of the through-holes 11 corresponds to the processing region in the present disclosure. At the rear surface 10b side of each through-hole 11, a counter electrode 12 is provided, which is common to a direct electrode 22 and an indirect electrode 23 of the template 20 (to be described later).

Meanwhile, a device layer (not illustrated), including, for example, an electronic circuit or wiring, is formed on the rear surface 10b of the wafer 10. The above-described counter electrode 12 is arranged on the device layer. Further, the wafer 10 is thinned, and a support substrate (not illustrated) is provided on the rear surface 10b side of the wafer 10 to support the thinned wafer 10. For example, a silicon wafer or a glass wafer is used as the support substrate.

Figure 2:
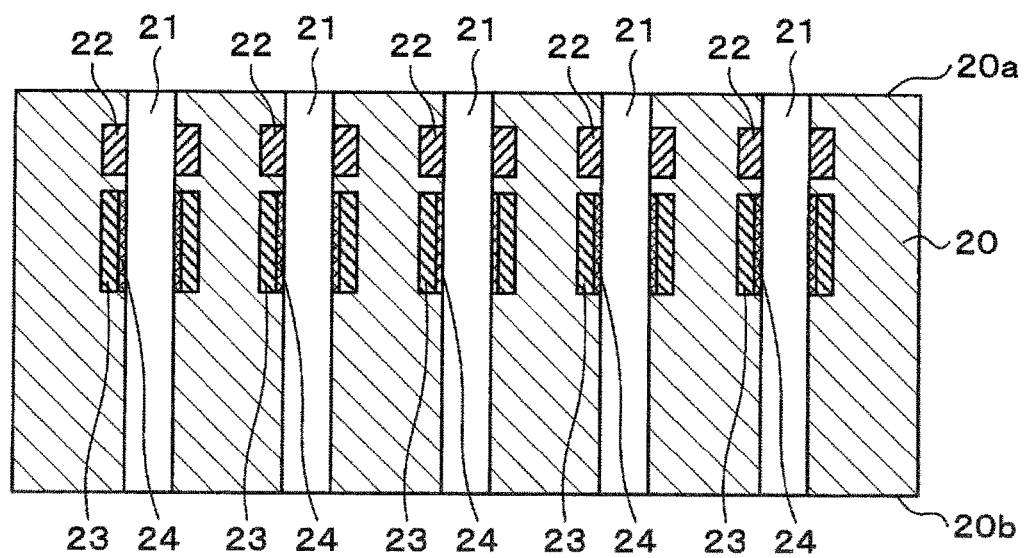
FIG. 2 is a vertical cross-sectional view illustrating a schematic configuration of a template.

The template 20 illustrated in FIG. 2 is substantially disc-shaped, and has the same shape as that of the wafer 10 in a plan view. For example, silicon carbide (SiC) is used for the template 20.

Figure 3:
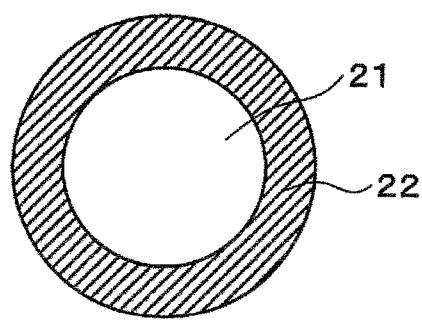
FIG. 3 is a horizontal cross-sectional view illustrating a schematic configuration of a direct electrode.
Figure 4:
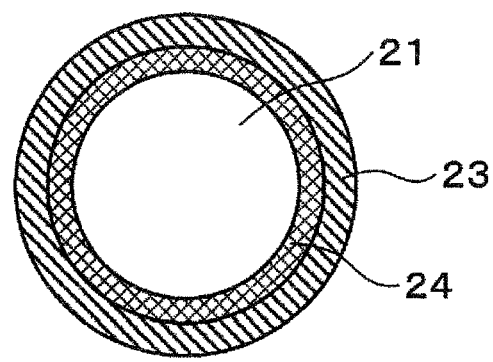
FIG. 4 is a horizontal cross-sectional view illustrating a schematic configuration of an indirect electrode and an insulating material.

The template 20 includes a plurality of passages 21 configured to distribute a plating liquid serving as a processing liquid. The plurality of passages 21 are formed at the positions facing the plurality of through-holes 11 when the template 20 is arranged on the front surface 10a side of the wafer 10. Each passage 21 is formed through the template 20 from a front surface 20a to a rear surface 20b thereof and extends in the thickness direction thereof. Further, both ends of the passage 21 are opened on the front surface 20a and the rear surface 20b, respectively. Further, as illustrated in FIGS. 3 and 4, the planar shape of the passage 21 is circular, and the passage 21 has a hollow cylindrical shape.

As illustrated in FIG. 2, a direct electrode 22 is provided in the upper portion of the passage 21. The direct electrode 22 is provided annularly to surround the passage 21 as illustrated in FIG. 3. Further, the direct electrode 22 is provided to be exposed inside the passage 21. Meanwhile, for example, when the template 20 is formed of a conductor, the direct electrode 22 does not need to be physically exposed inside the passage 21, but may be electrically conducted with the plating liquid in the passage 21.

Further, as illustrated in FIG. 2, an indirect electrode 23 is provided below the direct electrode 22 in the passage 21. The indirect electrode 23 is provided across an insulating material from the passage 21. Each of the indirect electrode 23 and the insulating material 24 is provided annularly to surround the passage 21, as illustrated in FIG. 4.

Subsequently, descriptions will be made on a plating processing using the wafer 10 and the template 20 configured as described above.

Figure 5:
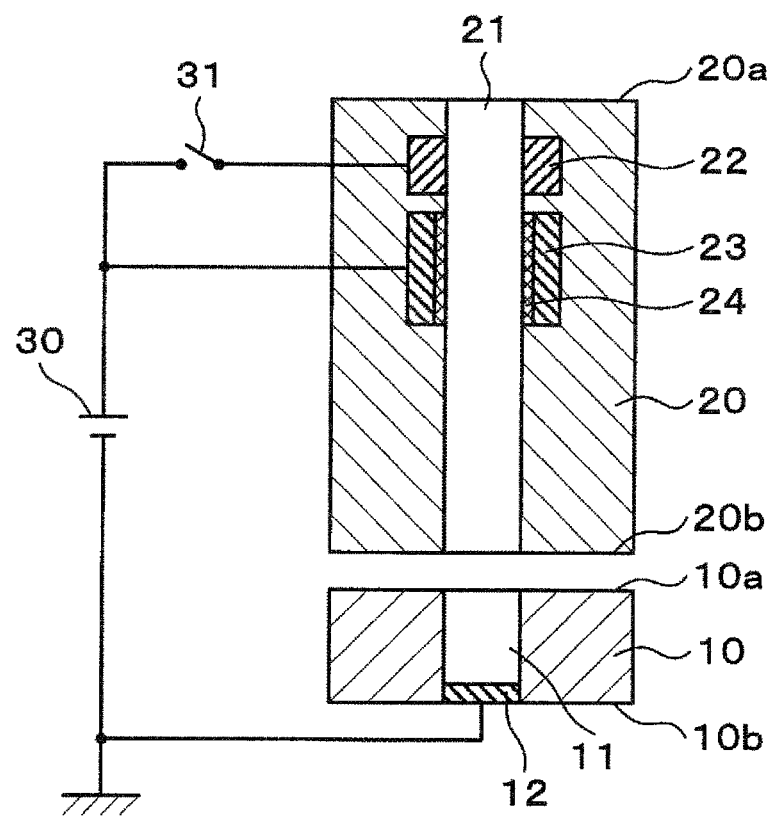
FIG. 5 is an explanatory view illustrating a state where the template is arranged to the wafer.

First, as illustrated in FIG. 5, the template 20 is arranged on the front surface 10a side of the wafer 10. In this case, the template 20 is arranged by adjusting the position thereof such that the through-hole 11 and the passage 21 face each other. For the convenience of description, one through-hole 11 and one passage 21 are illustrated in FIG. 5. In practice, however, a plurality of through-holes 11 and a plurality of passages 21 face each other. Further, a gap is illustrated between the template 20 and the wafer 10. However, since the gap is very small in practice, the plating liquid supplied from the passage 21 is able to enter the inside of the through-hole 11 as it is, which will be described later. Alternatively, in the rear surface 20b of the template 20 and the front surface 10a of the wafer 10, a hydrophilization treatment may be performed on only a portion around the opening of the passage 21 and the through-hole 11, as necessary.

The counter electrode 12, the direct electrode 22, and the indirect electrode 23 are connected to a DC power source 30. The counter electrode 12 is connected to a negative electrode side of the DC power source 30. Each of the direct electrode 22 and the indirect electrode 23 is connected to a positive electrode side of the DC power source 30. In addition, a switch 31 is provided between the direct electrode 22 and the DC power source 30 to switch a connection state of the direct electrode 22 and the DC power source 30. When the switch is turned ON, the direct electrode 22 and the DC power source 30 are connected so that a current flows between the direct electrode 22 and the counter electrode 12. Further, when the switch 31 is turned OFF, the direct electrode 22 and the DC power source 30 are disconnected so that a current does not flow between the direct electrode 22 and the counter electrode 12. Meanwhile, the DC power source 30 is used as a common power source to a plurality of counter electrodes 12, a plurality of direct electrodes 22, and a plurality of indirect electrodes 23. The DC power source 30 can be used in common for a plurality of direct electrodes 22 and a plurality of indirect electrodes 23. Therefore, particularly, for the template 20 including a plurality of fine passages 31 formed therein, the apparatus configuration may be simplified.

Figure 6:
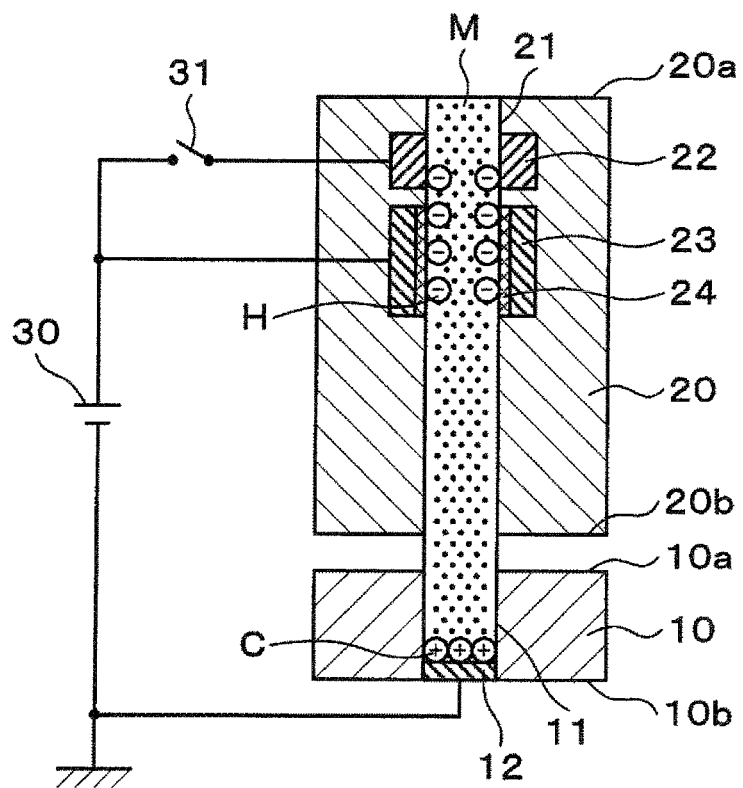
FIG. 6 is an explanatory view illustrating a state where a plating liquid is supplied to a through-hole through a passage, and a voltage is applied between the indirect electrode and a counter electrode.

Thereafter, as illustrated in FIG. 6, the plating liquid M is supplied to the through-hole 11 of the wafer 10 through the passage 21 of the template 20. Then, the plating liquid M is filled in the passage 21 and the through-hole 11. As the plating liquid M, a mixed liquid obtained, for example, by dissolving copper sulfate and sulfuric acid is used. In the plating liquid M, copper ions are contained as the processing target ions.

Figure 7:
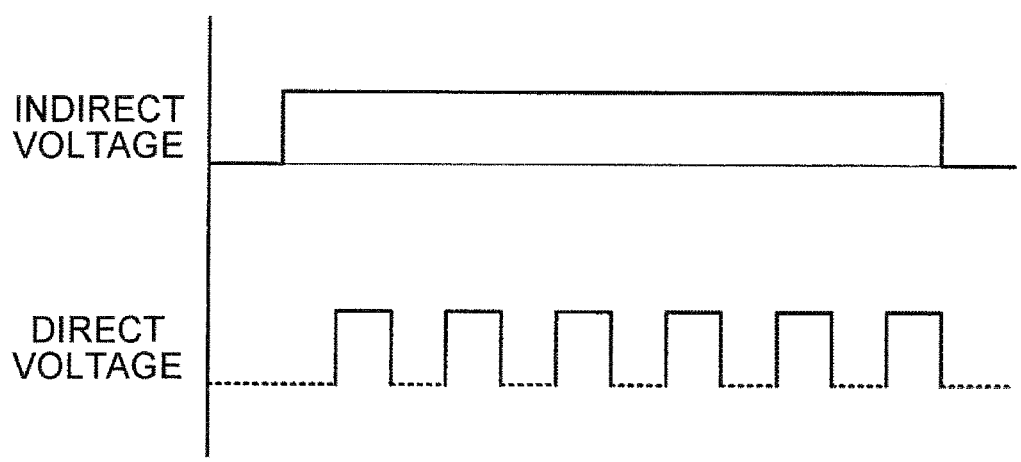
FIG. 7 is a graph illustrating a state where a DC voltage is continuously applied between the indirect electrode and the counter electrode while a DC voltage is applied in a pulse form between the direct electrode and the counter electrode.

Thereafter, as illustrated in FIG. 7, a DC voltage is continuously applied between the indirect electrode 23 and the counter electrode 12, while a DC voltage is applied in a pulse form, that is, a so-called pulse voltage is applied between the direct electrode 22 and the counter electrode 12.

More specifically, as illustrated in FIG. 6, a DC voltage is applied in a state where the indirect electrode 23 is set to a positive pole and the counter electrode 12 is set to a negative pole to form an electrostatic field. Thus, negatively charged particles H, for example, sulfate ions or electrons are collected on the indirect electrode 23 side and the direct electrode 22 side, and copper ions C are caused to migrate to the counter electrode 12 side. Meanwhile, in FIG. 6, the number of the ions accumulated on the indirect electrode 23 side and the number of the ions accumulated on the counter electrode 12 side are different from each other. However, the charge amounts of the ions accumulated on the indirect electrode 23 side and the counter electrode 12 side are balanced. The same is applied to the other drawings. At this time, the switch 31 is turned OFF, so that the direct electrode 22 and the DC power source 30 are not connected to each other. However, in order to avoid the direct electrode 22 from becoming a positive pole, the direct electrode 22 is brought into a floating state without being connected to the ground.

Figure 8:
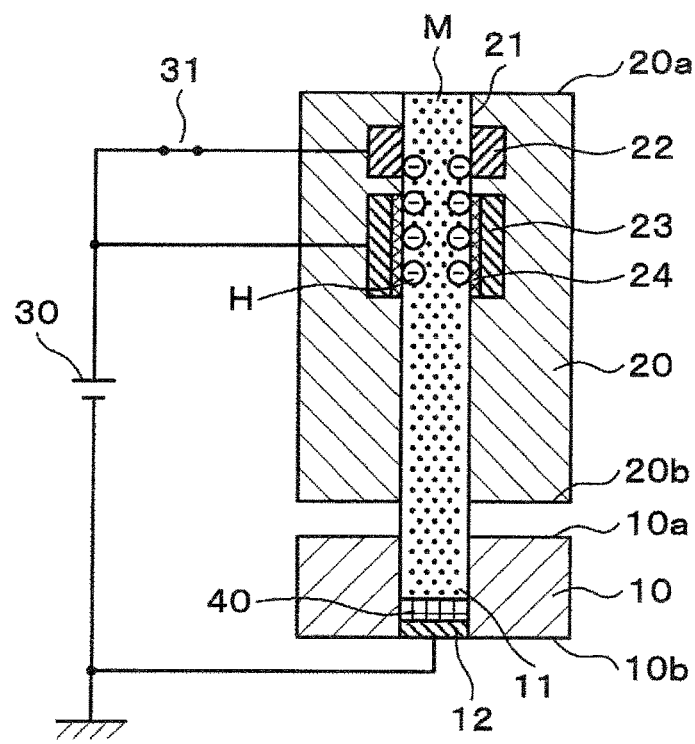
FIG. 8 is an explanatory view illustrating a state where a voltage is applied between the direct electrode and the counter electrode.

Thereafter, when sufficient copper ions C migrate to and are accumulated on the counter electrode 12 side, the switch 31 is turned ON as illustrated in FIG. 8. Then, a voltage is applied in a state where the direct electrode 22 is set to a positive pole and the counter electrode 12 is set to a negative pole so that a current flows between the direct electrode 22 and the counter electrode 12. Thus, the charges of the copper ions C that have migrated to the counter electrode 12 side are exchanged and the copper ions C are reduced so that a copper plating 40 is precipitated on the counter electrode 12 side. In this case, since sufficient copper ions C are accumulated on the counter electrode 12 side, the copper plating 40 may be uniformly precipitated on the counter electrode 12 side.

Meanwhile, hydrogen ions are also caused to migrate to the counter electrode 12 side by the voltage applied between the indirect electrode 23 and the counter electrode 12. However, since the copper ions C have a higher ionization tendency than the hydrogen ions, the hydrogen ions are not reduced by the voltage applied between the direct electrode 22 and the counter electrode 12, but only the copper ions C are reduced. Therefore, the copper plating 40 may be more uniformly precipitated on the counter electrode 12 side without generating any void.

Figure 9:
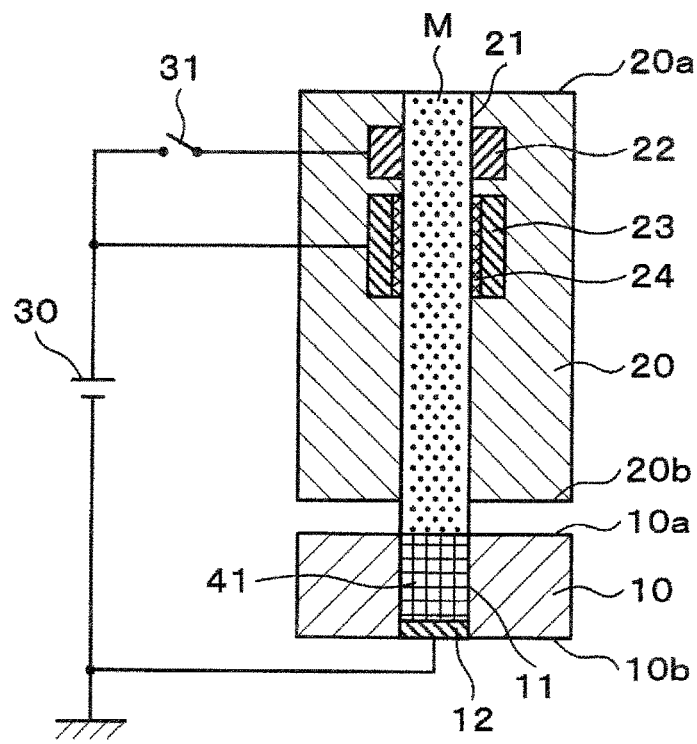
FIG. 9 is an explanatory view schematically illustrating a state where a through silica via is formed inside the through-hole.

As the migration-accumulation of the copper ions C and the reduction of the copper ions C are conducted repeatedly in this manner, the copper plating 40 is grown so that a through silicon via 41 is formed in the through-hole 11 as illustrated in FIG. 9.

According to the exemplary embodiments described above, the copper ions C may be caused to migrate to the counter electrode 12 side by applying a voltage between the indirect electrode 23 and the counter electrode 12, and the copper ions C may be reduced on the counter electrode 12 side by supplying a voltage between the direct electrode 22 and the counter electrode 12 in a state where the copper ions C are sufficiently collected around the counter electrode 12. Thus, since the migration of the copper ions C and the reduction of the copper ions C are conducted individually by a voltage between different electrodes, the plating processing may be efficiently performed in a short time. Further, since a mode to cause the copper ions C to migrate and a mode to reduce the copper ions C are able to be performed just by switching ON and OFF of the switch 31, the plating processing may be more efficiently performed. Meanwhile, the electrostatic field is applied to the plating liquid M even in the mode to reduce the copper ions C.

Further, since the passage 21 is formed to extend in the thickness direction of the template 20 and through the template 20, the plating liquid M may be selectively supplied to the passage 21 and the through-hole 11 using the template 20 having a capillary structure. Therefore, since a large amount of the plating liquid stored in the plating bath as in the conventional electrolytic plating method is not necessary, the supply amount of the plating liquid M may be suppressed to a small amount. Accordingly, the migration distance of the copper ions C in the plating liquid M is shortened so that the migration of the copper ions C may be conducted in a short time.

Further, since the copper plating is formed on, for example, the surface of the wafer, in addition to the inside of the through-hole, in the conventional electrolytic plating method, it is necessary to remove any copper plating formed in a portion other than the inside of the through-hole by, for example, chemical mechanical polishing (CMP) after the plating processing. In contrast, according to the present exemplary embodiment, since the plating liquid M is able to be selectively supplied to the through-hole 11 using the template 20, the plating 40 may be precipitated only in the inside of the through-hole 11, so that a copper plating removing step such as, for example, conventional chemical mechanical polishing, may be omitted. Accordingly, the throughput of the plating processing may be enhanced.

Further, since there is no need for a large-scale mechanism for stirring and circulating a large amount of plating liquid as in the conventional technique, the apparatus configuration may be simplified.

Further, the copper ions C may always be caused to migrate to the counter electrode 12 side by continuously applying a DC voltage between the indirect electrode 23 and the counter electrode 12, and the copper ions C may be reduced in a state where sufficient copper ions C have migrated to and have been accumulated on the counter electrode 12 side, by supplying a DC voltage in a pulse form between the direct electrode 22 and the counter electrode 12.

Therefore, it is unnecessary to flow a useless current between the anode and the wafer as in the conventional electrolytic plating method, and the copper ions C may be efficiently reduced. Further, the copper plating 40 may be uniformly precipitated by uniformly reducing the copper ions C uniformly accumulated on the counter electrode 12 side. Further, since the electrolytic reaction may be subdivided by applying a DC voltage in a pulse form, the electrolytic reaction may be finely performed, and a dense copper plating 40 may be precipitated. Therefore, the plating processing may be uniformly performed.

In the exemplary embodiment described above, the counter electrode 12 was used as an electrode in common to the direct electrode 22 and the indirect electrode 23, but the indirect electrode 23 does not need to be used as a pair with the counter electrode 12. That is, the indirect electrode 23 may be used alone as a condenser, and an electrostatic field may be formed by applying a voltage to the indirect electrode 23. By the electrostatic field, the negatively charged particles H migrate to the indirect electrode 23 side and the direct electrode 22 side and the copper ions C migrate to the counter electrode 12 side. Meanwhile, since the copper ions C accumulated on the counter electrode 12 side are reduced by causing a current to flow between the direct electrode 22 side and the counter electrode 12 side, the direct electrode 22 needs to be used as a pair with the counter electrode 12.

In this case, the power source of the indirect electrode 23 may be used as a power source separate from the DC power source 30. That is, the DC power source 30 does not need to be used as a power source in common to the direct electrode 22 and the indirect electrode 23. The power sources of the direct electrode 22 and the indirect electrode 23 may be arbitrarily set.

Also in the present exemplary embodiment, since the copper ions C are caused to migrate to the counter electrode 12 side by supplying a voltage to the indirect electrode 23, it is possible to enjoy the same effect as in the above-described exemplary embodiment.

In the template 20 of the exemplary embodiments described above, as illustrated in FIG. 10, the direct electrode 22 may be arranged at the same height as the top surface of the plating liquid M remaining in the passage 21 at the end of the plating processing. As the copper plating 40 is precipitated from the plating liquid M, the sum of the volume of the plating liquid M and the copper plating 40 is decreased. In this case, when the through silicon via 41 is formed in the through-hole 11, the direct electrode 22 does not come in contact with the plating liquid M. Therefore, the plating processing is automatically terminated. According to the present exemplary embodiment, it is possible to avoid any undue plating processing. Therefore, the through silicon via 41 may be more appropriately formed, and the plating processing may be more efficiently performed.

Figure 11:
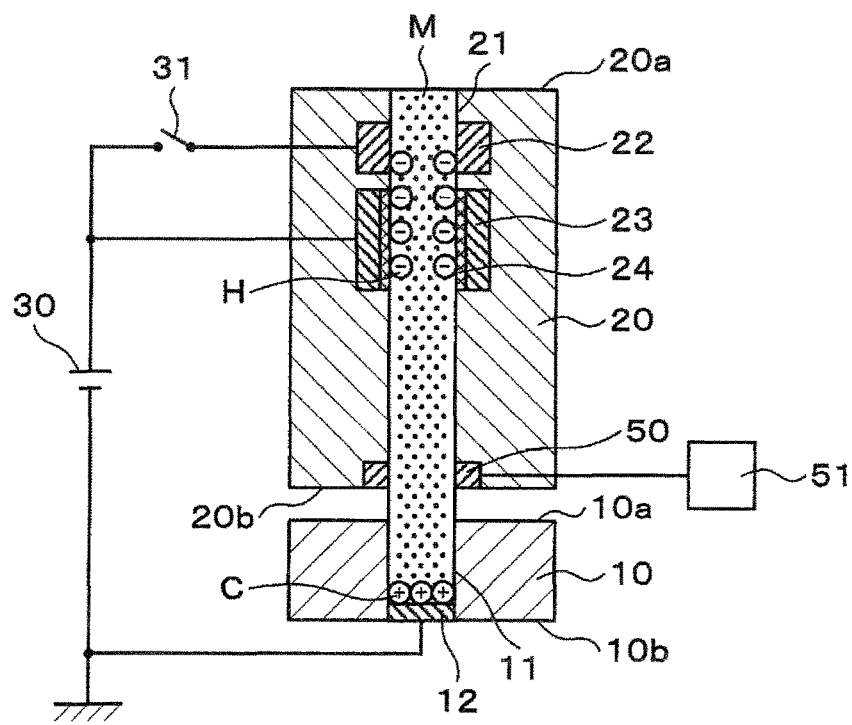
FIG. 11 is a vertical cross-sectional view illustrating a schematic configuration of a template according to another exemplary embodiment.

In the exemplary embodiments described above, the template 20 may include a monitor electrode 50 configured to inspect a state of the plating processing, as illustrated in FIG. 11. The monitor electrode 40 is provided so as to surround the passage 21 in the rear surface 20b of the template 20. Then, a current value flowing between the monitor electrode 50 and the counter electrode 12 is measured in a controller 51, and the processing state of the plating processing is inspected by a change of the measured of the current value. Since the internal resistance decreases as the copper plating 40 is grown in the through-hole 11, the current value is also changed. A predetermined current value flowing between the monitor electrode 50 and the counter electrode 12 when the copper plating 40 is grown up to the front surface 10a of the wafer 10, that is, when the through silicon via 41 is formed in the through-hole 11, is measured in advance. Then, in a practical manufacturing process, when the copper plating 40 is grown to some extent, each of the application of the voltage by the indirect electrode 23 and the application of the voltage between the direct electrode 22 and the counter electrode 12 is stopped, and the current value flowing between the monitor electrode 50 and the counter electrode 12 is measured. When the current value measured in the controller 51 is the predetermined current value, it is determined that the through silicon via 41 is formed in the through-hole 11, so that the application of the voltage by the indirect electrode 23 and the application of the voltage between the direct electrode 22 and the counter electrode 12 are completely stopped. According to the present exemplary embodiment, the end point of the plating processing may be measured, and the plating processing may be suppressed from being excessively performed. Therefore, the through silicon via 41 may be more properly formed, and the plating processing may be more efficiently performed.

Meanwhile, after the through silicon via 41 is formed in the through-hole 11, inspection is made on electric characteristics of for example, the through silicon via 41 of the wafer 10 or an electronic circuit of a device layer. The monitor electrode 50 may be used as an inspection electrode of the electric characteristics.

Figure 12:
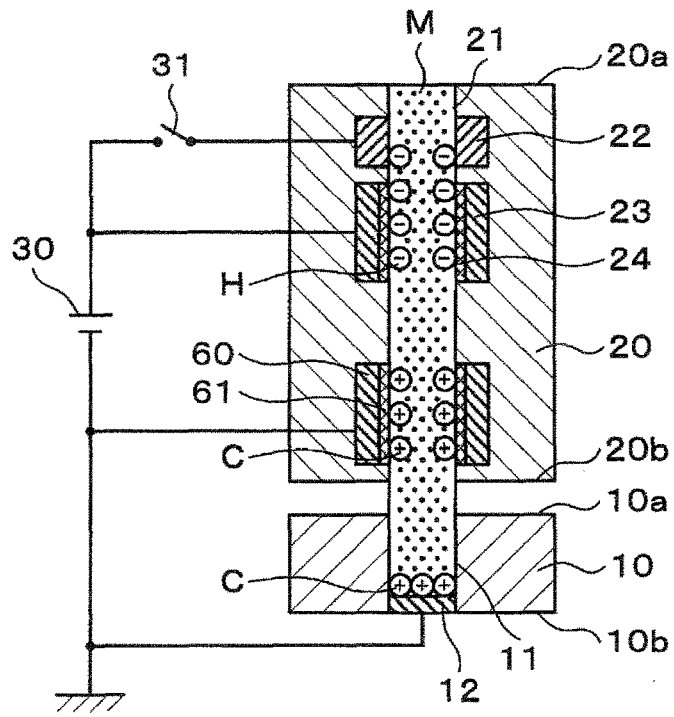
FIG. 12 is a vertical cross-sectional view illustrating a schematic configuration of a template according to another exemplary embodiment.

In the template 20 of the exemplary embodiments described above, as illustrated in FIG. 12, another indirect electrode 60 ("second indirect electrode 60") may be provided in the passage 21 closer to the wafer 10 side than the indirect electrode 23, that is, below the indirect electrode 23 in the passage 21. An insulating material 61 is provided between the second indirect electrode 60 and the passage 21, and the second indirect electrode 60 and the insulating material 61 are provided annularly to surround the passage 21. Further, when the template 20 is arranged on the wafer 10, the second indirect electrode 60 is connected to the negative electrode of the DC power source 30.

In this case, when performing the plating processing, a DC voltage is applied in a state where the indirect electrode 23 is set to a positive pole and the counter electrode 12 is set to a negative pole while a DC voltage is applied in a state where the indirect electrode 23 is set to a positive pole and the second indirect electrode 60 is set to a negative pole. Thus, the negatively charged particles H are collected on the indirect electrode 23 and direct electrode 22 side, and the copper ions C are collected on the second indirect electrode 60 side. When second indirect electrode 60 is provided in this manner, the copper ions C may be collected on the wafer 10 side rather than the indirect electrode 23 side. Therefore, the migration of the copper ions C to the counter electrode 12 side may be more efficiently performed in a short time.

Figure 13:
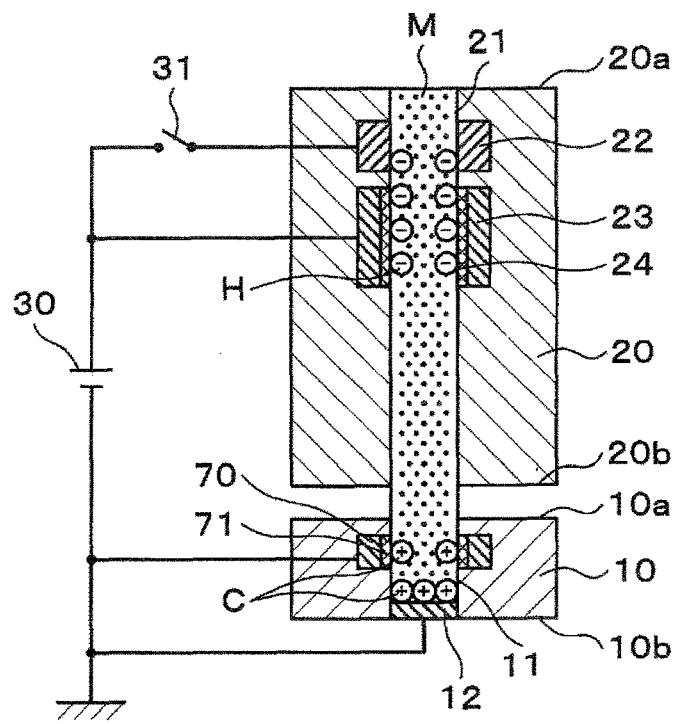
FIG. 13 is a vertical cross-sectional view illustrating a schematic configuration of a template and a wafer according to another exemplary embodiment.

In the wafer 10 of the exemplary embodiments described above, as illustrated in FIG. 13, another indirect electrode 70 ("second indirect electrode 70") may be provided in the through-hole 11 closer to the template 20 side than the counter electrode 12, that is, above the counter electrode 12 in the through-hole 11. An insulating material 71 is provided between the second indirect electrode 70 and the through-hole 11, and the second indirect electrode 70 and the insulating material 71 are provided annularly to surround the through-hole 11. Further, when the template 20 is arranged on the wafer 10, the second indirect electrode 70 is connected to the negative electrode of the DC power source 30.

In this case, when performing the plating processing, a DC voltage is applied in a state where the indirect electrode 23 is set to a positive pole and the counter electrode 12 is set to a negative pole while a DC voltage is applied in a state where the indirect electrode 23 is set to a positive pole and the second indirect electrode 70 is set to a negative pole. Thus, the negatively charged particles H are collected on the indirect electrode 23 side and the direct electrode 22 side, and the copper ions C are collected on the second indirect electrode 70 side. When second indirect electrode 70 is provided in this manner, the copper ions C may be collected on the wafer 10 side rather than the indirect electrode 23 side. Therefore, the migration of the copper ions C to the counter electrode 12 side may be more efficiently performed in a short time.

Figure 10:
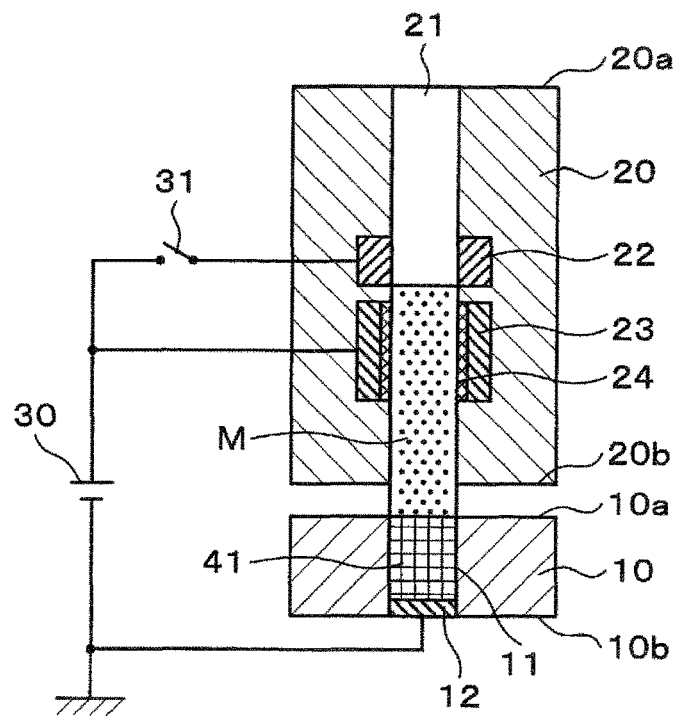
FIG. 10 is a vertical cross-sectional view illustrating a schematic configuration of a template according to another exemplary embodiment.

Also in the present exemplary embodiment, as illustrated in FIG. 10, the direct electrode 22 may be arranged at the same height as the top surface of the plating liquid M remaining in the passage 21 at the end of the plating processing.

In the template 20 of the exemplary embodiments described above, as illustrated in FIG. 14, the indirect electrode 23 may extend to the rear surface 20 of the template 20. In this case, when performing the plating processing, a DC voltage is applied in a state where the indirect electrode 23 is set to a positive pole and the counter electrode 12 is set to a negative pole. Thus, the negatively charged particles H are collected on the indirect electrode 23 side and the direct electrode 22 side. In the present exemplary embodiment, since the area of the indirect electrode 23 is increased, more negatively charged particles H may be collected. In other words, the braking force of the copper ions C to the counter electrode 12 side may be increased. Therefore, the migration of the copper ions C to the counter electrode 12 side may be more efficiently performed in a short time.

Figure 14:
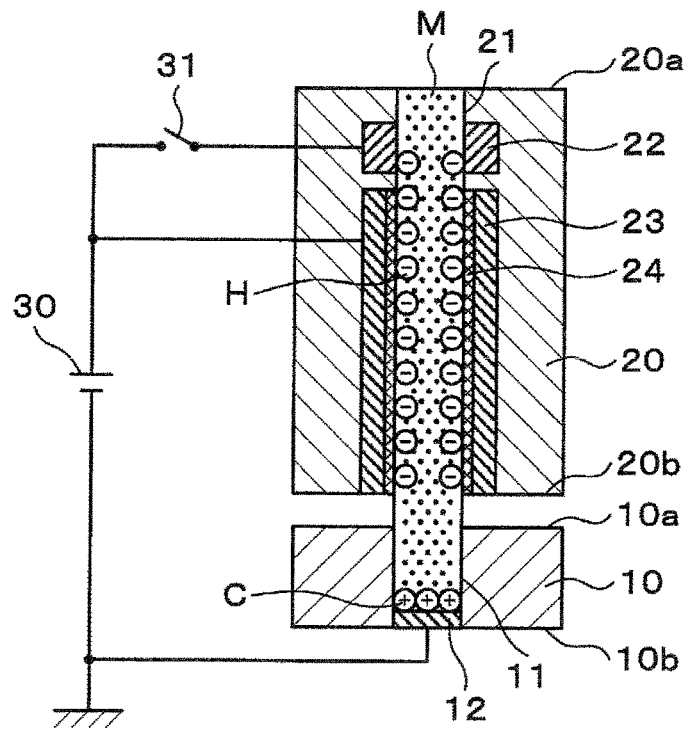
FIG. 14 is a vertical cross-sectional view illustrating a schematic configuration of a template according to another exemplary embodiment.
Figure 15:
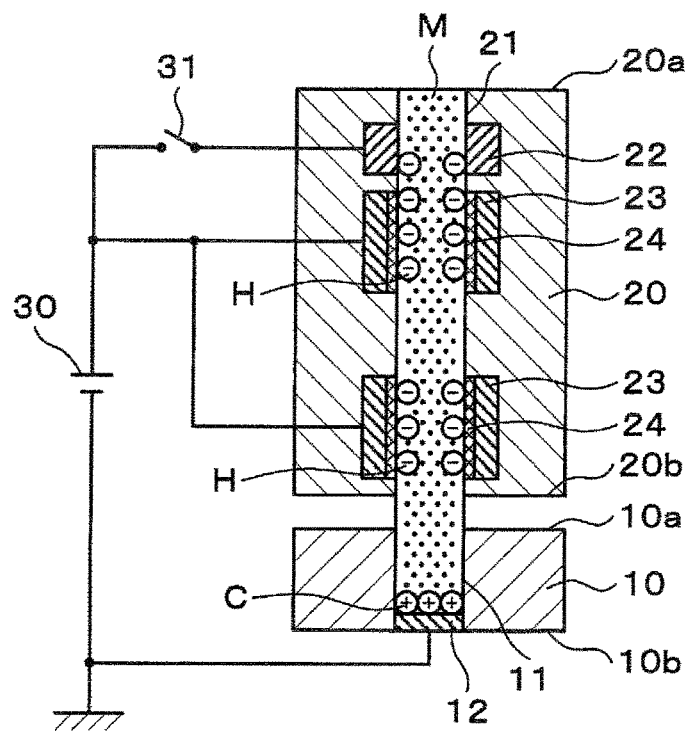
FIG. 15 is a vertical cross-sectional view illustrating a schematic configuration of a template according to another exemplary embodiment.

Meanwhile, in order to increase the braking force of the copper ions C to the counter electrode 12, the indirect electrode 23 may extend to the rear surface 20b of the template 20 as illustrated in FIG. 14, or a plurality of indirect electrodes 23 may be provided below the direct electrode 22 as illustrated in FIG. 15. Each of the plurality of indirect electrodes 23 is connected to the positive electrode side of the DC power source 30.

Figure 16:
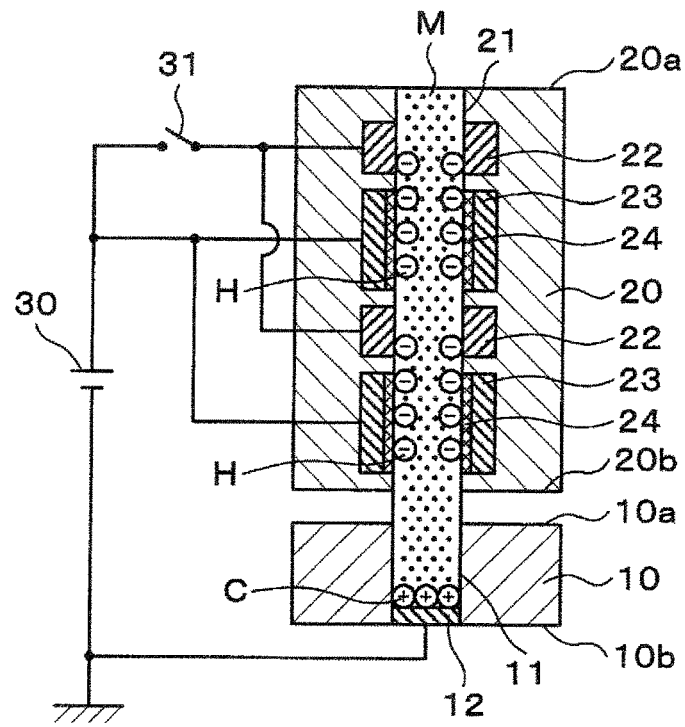
FIG. 16 is a vertical cross-sectional view illustrating a schematic configuration of a template according to another exemplary embodiment.

In the template 20 of the exemplary embodiment described above, as illustrated in FIG. 16, a plurality of (e.g., two) direct electrodes 22 and a plurality of (e.g., two) indirect electrodes 23 may be provided. The direct electrodes 22 and the indirect electrodes 23 are provided alternately in this order from the top. Further, when the template 20 is arranged on the wafer 10, each of the two direct electrodes 22 and the two indirect electrodes 23 is connected to the positive electrode of the DC power source 30. The switch 31 is provided between the two direct electrodes 22 and the DC power source 30. Meanwhile, the number of the direct electrodes 22 and the indirect electrodes 23 may be arbitrarily set without being limited to the present exemplary embodiment.

In such a case, when performing the plating processing, a DC voltage is applied in a state where the two indirect electrodes 23 are set to a positive pole and the counter electrode 12 is set to a negative pole. Thus, the negatively charged particles H are collected on both of the two indirect electrodes 23 sides and the two direct electrodes 22 sides. Therefore, the migration of the copper ions C to the counter electrode 12 side may be more efficiently performed in a short time.

Figure 17:
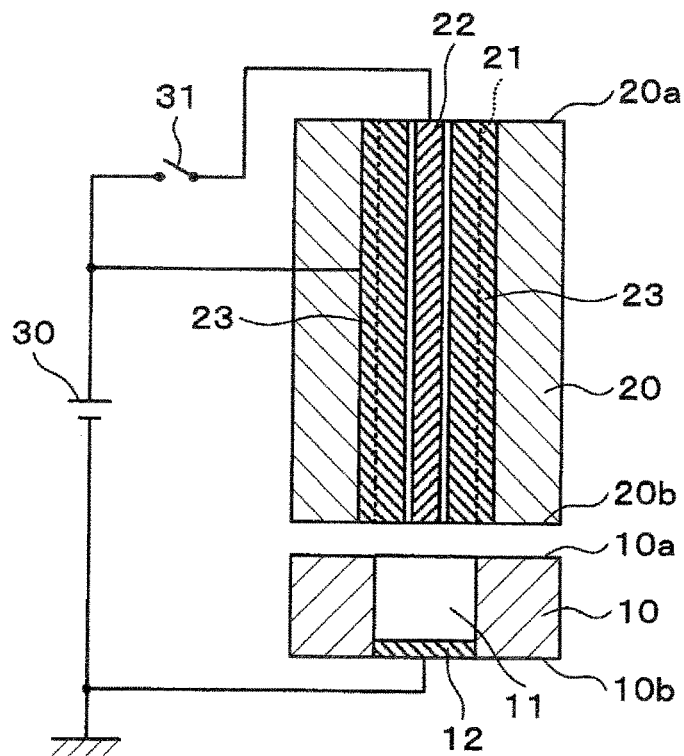
FIG. 17 is a vertical cross-sectional view illustrating a schematic configuration of a template according to another exemplary embodiment.
Figure 18:
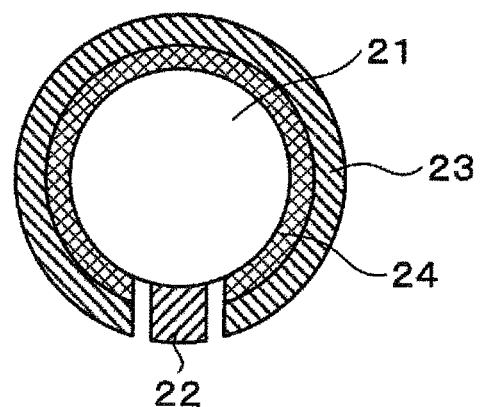
FIG. 18 is a horizontal cross-sectional view illustrating a schematic configuration of a direct electrode and an indirect electrode according to another exemplary embodiment.

In the template 20 of the exemplary embodiment described above, the direct electrode 22 and the indirect electrode 23 are provided side by side in the vertical direction. However, as illustrated in FIG. 17, the direct electrode 22 and the indirect electrode 23 may be arranged side by side in the horizontal direction. Each of the direct electrode 22 and the indirect electrode 23 is provided so as to extend from the front surface 20a to the rear surface 20b of the template 20 in the thickness direction. Further, the direct electrode 22 and the indirect electrode 23 are arranged side by side so as to surround the passage 21 in a plan view, as illustrated in FIG. 18.

Figure 19:
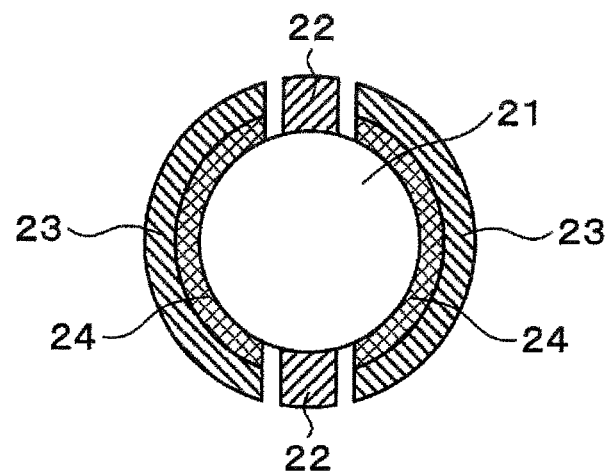
FIG. 19 is a horizontal cross-sectional view illustrating a schematic configuration of a direct electrode and an indirect electrode according to another exemplary embodiment.

Meanwhile, a plurality of direct electrodes 22 and a plurality of indirect electrodes 23 may be arranged side by side so as to surround the passage 21 in a plan view, as illustrated in FIG. 19. Further, the number of the direct electrodes 22 and the indirect electrodes 23 may be arbitrarily set without being limited to the example as illustrated.

Even in the case where the direct electrode 22 and the indirect electrode 23 are provided side by side in the horizontal direction as in the present exemplary embodiment, it is possible to enjoy the same effect as in the case where the direct electrode 22 and the indirect electrode 23 are provided side by side in the vertical direction as described in the above-described exemplary embodiment. That is, the plating processing may be efficiently performed in a short time. In addition, the plating processing may be uniformly performed.

In the template 20 of the exemplary embodiments described above, the direct electrode 22 is provided around the passage 21, but may be provided in parallel with the counter electrode 12 inside the passage 21. In such a case, the copper plating 40 may be more efficiently precipitated on the counter electrode 12 side. Thus, the plating processing may be efficiently performed.

In the exemplary embodiment described above, descriptions were made on the case of performing the plating processing as a predetermined processing of the wafer 10. However, the present disclosure may be applied to various electrolytic processes.

For example, the present disclosure may be applied when an etching processing is performed on the wafer 10, and the through-hole 11 is formed in the wafer 10. In such a case, the processing target ions are anions, and the processing target ions are oxidized on the counter electrode 12 side.

Figure 20:
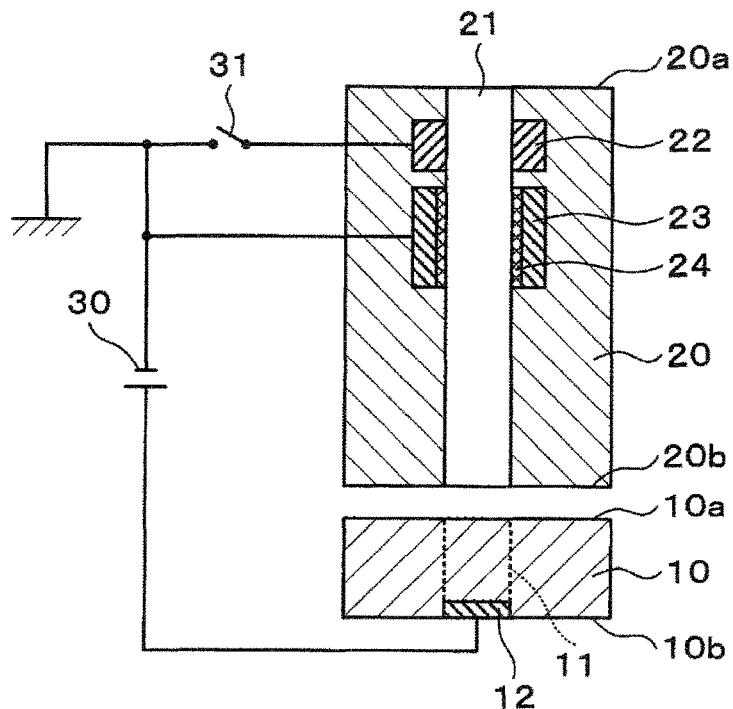
FIG. 20 is a vertical cross-sectional view illustrating a schematic configuration of a template and a wafer according to another exemplary embodiment.

As illustrated in FIG. 20, the counter electrode 12 is provided on the rear surface 10b side of a place in the wafer 10 where the through-hole 11 is formed (a portion indicated by a dotted line in FIG. 20). The counter electrode 12 is connected to the positive electrode of the DC power source 30. Further, the direct electrode 22 and the indirect electrode 23 are connected to the negative electrode of the DC power source 30, respectively. Meanwhile, in the present exemplary embodiment, the place in the wafer 10 where the through-hole 11 is formed corresponds to the processing region in the present disclosure.

Figure 21:
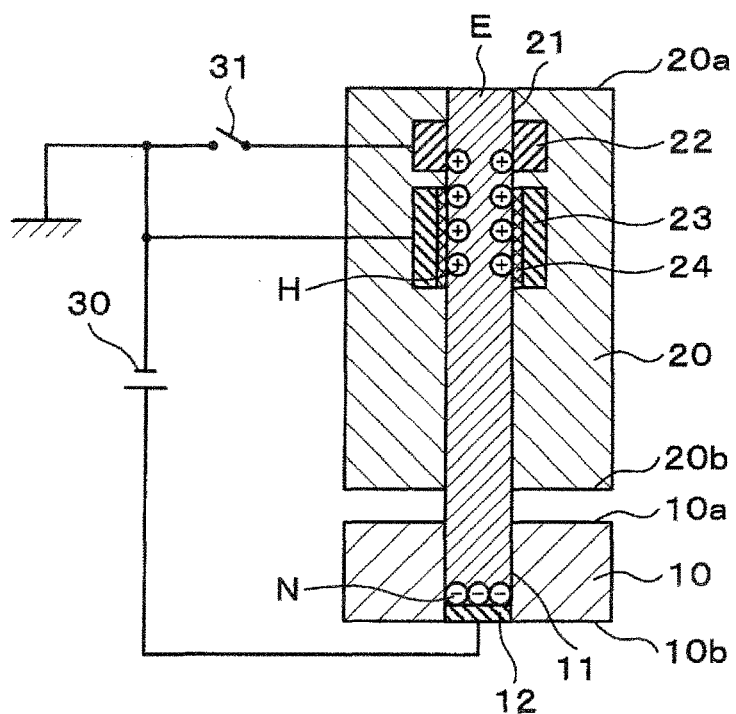
FIG. 21 is an explanatory view illustrating a state where a wafer is etched to form a through-hole in another exemplary embodiment.

Then, after the template 20 is arranged on the front surface 10a of the wafer 10, an etching liquid E is supplied as the processing liquid to the place where the through-hole 11 of the wafer 10 is formed (the processing region), through the passage 21, as illustrated in FIG. 21. As the etching liquid E, a mixed liquid (HF/IPA) of hydrofluoric acid and isopropyl alcohol, or a mixed liquid of hydrofluoric acid and ethanol, for example, is used.

Thereafter, a DC voltage is continuously applied between the indirect electrode 23 and the counter electrode 12 in a state where the indirect electrode 23 is set to a negative pole and the counter electrode 12 is set to a positive pole, so that positively charged particles H are collected on the indirect electrode 23 side and the direct electrode 22 side, and processing target ions N, which are anions in the etching liquid E, are caused to migrate to the counter electrode 12 side. Then, a DC voltage is applied between the direct electrode 22 and the counter electrode 12 in a state where the direct electrode 22 is set to a negative pole and the counter electrode 12 is set to a positive pole in a state where sufficient processing target ions N have migrated to and have been accumulated on the counter electrode 12 side, so that the processing target ions N are oxidized. At this time, when the voltage between the direct electrode 22 and the counter electrode 12 is applied in a pulse form, a migration-accumulation mode of the processing target ions N and an oxidation mode of the processing target ions N may be performed repeatedly. Then, the wafer 10 is etched so that the through-hole 11 is formed. Meanwhile, since the migration-accumulation and the oxidation of the processing target ions N are similar to the above-described exemplary embodiment, detailed descriptions thereof will be omitted.

Even in a case where the etching processing is performed as in the present exemplary embodiment, it is possible to enjoy the same effect as in the above-described exemplary embodiment. That is, the etching processing may be efficiently performed in a short time. In addition, the etching processing may be uniformly performed. Further, since the processing target ions N is uniformly oxidized on the counter electrode 12 side, anisotropy of the etching processing is enhanced, and thus, the through-hole 11 may be properly formed.

Further, for example, the present disclosure may also be applied when an electrodeposited insulating film is formed in the through-hole 11. The electrodeposited insulating film is formed on an inner surface of the through-hole 11 before the through silicon via 41 is formed.

Figure 22:
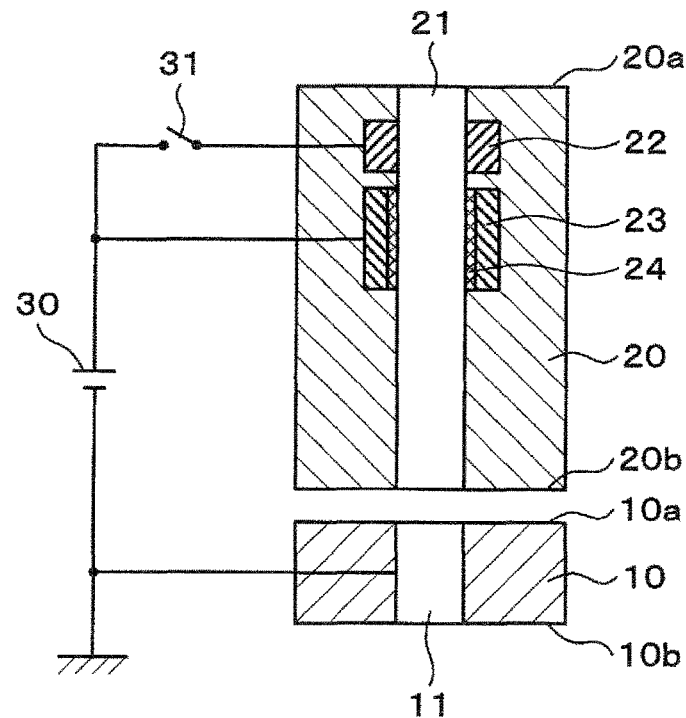
FIG. 22 is a vertical cross-sectional view illustrating a schematic configuration of a template and a wafer according to another exemplary embodiment.

In this case, the through-hole 11 is formed in the wafer 10 as illustrated in FIG. 22. Meanwhile, in the present exemplary embodiment, the inner surface of the through-hole 11 corresponds to the processing region and the counter electrode in the present disclosure.

Figure 23:
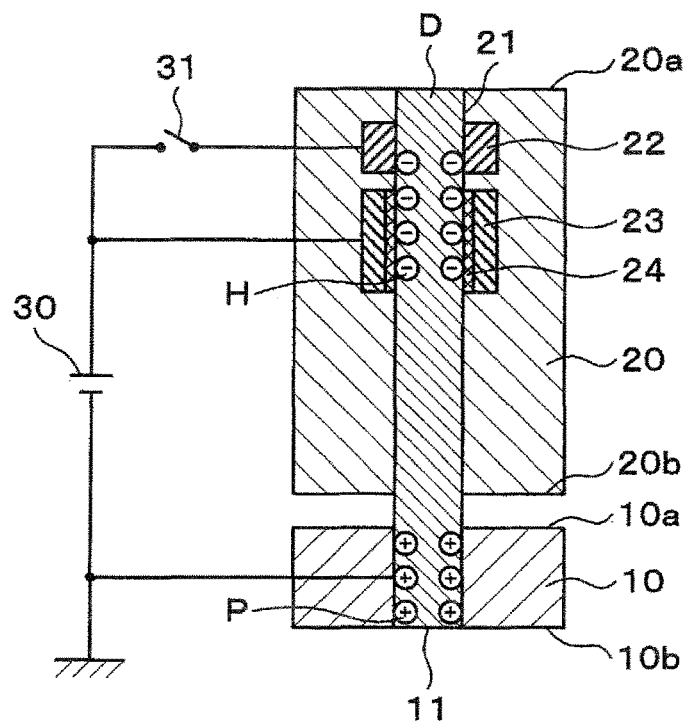
FIG. 23 is an explanatory view illustrating a state where a voltage is applied between an indirect electrode and a counter electrode in another exemplary embodiment.

Then, after the template 20 is arranged on the front surface 10a side of the wafer 10, an electrodeposited insulating film solution D is supplied as the processing liquid into the through-hole 11 of the wafer 10 through the passage 21, as illustrated in FIG. 23. As the electrodeposited insulating film solution D, an electrodeposition polyimide solution, for example, is used.

Figure 24:
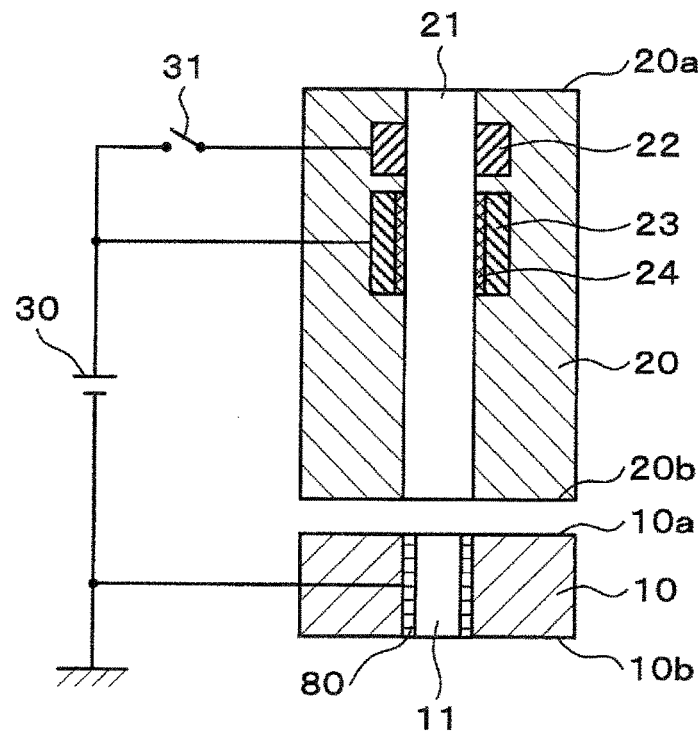
FIG. 24 is an explanatory view illustrating a state where an electrodeposited insulating film is formed on an inner surface of a through-hole in another exemplary embodiment.

Thereafter, a DC voltage is continuously applied between the indirect electrode 23 and the inner surface of the through-hole 11, so that negatively charged particles H are collected on the indirect electrode 23 side and the direct electrode 22 side, and processing target ions P, which are cations in the electrodeposited insulating film solution D, are caused to migrate to the inner surface side of the through-hole 11. When a DC voltage is applied to the inner surface of the through-hole 11, similarly to the above-described exemplary embodiment, the inner surface of the through-hole 11 functions as the counter electrode, so that the processing target ions P migrate thereto and are accumulated thereon. Then, a DC voltage is applied between the direct electrode 22 and the wafer 10 in a state where sufficient processing target ions P have migrated to and accumulated on the inner surface of the through-hole 11, so that the processing target ions P are reduced. At this time, when the voltage between the direct electrode 22 and the wafer 10 is applied in a pulse form, a migration-accumulation mode of the processing target ions P and an oxidation mode of the processing target ions P may be performed repeatedly. Then, the electrodeposited insulating film 80 is formed on the inner surface of the through-hole 11 as illustrated in FIG. 24. Meanwhile, since the migration-accumulation and the reduction of the processing target ions P are similar to the above-described exemplary embodiment, detailed descriptions thereof will be omitted.

Even in a case where the electrodeposited insulating film 80 is formed on the inner surface of the through-hole 11 as in the present exemplary embodiment, it is possible to enjoy the same effect as in the above-described exemplary embodiment. That is, the formation of the electrodeposited insulating film 80 may be efficiently performed in a short time. In addition, the electrodeposited insulating film 80 may be uniformly formed.

Meanwhile, in a case where the through silicon via 41 formed in the through-hole 11 is a through silicon via for ground, it is unnecessary to form an electrodeposited insulating film on the inner surface of the through-hole 11. In this regard, in the present exemplary embodiment, when a voltage is selectively applied only to the electrodeposited insulating film solution D supplied to a through-hole 11 other than the through-hole 11 for ground, such as, for example, a through-hole 11 for a signal line or a power source line, it is possible to form the electrodeposited insulating film 80 only on the inner surface of the through-hole 11 for the signal line or the power source line without forming the electrodeposited insulating film on the inner surface of the through-hole 11 for ground.

Further, cationic electrodeposition and anionic electrodeposition are used to form the electrodeposited insulating film 80. In a case of the cationic electrodeposition, reduction of the processing target ions is conducted as in the above-described exemplary embodiment. Meanwhile, in a case of the anionic electrodeposition, oxidation of the processing target ions is conducted.

In the template 20 of the exemplary embodiments described above, the direct electrode 22 and the indirect electrode 23 may have an arbitrary configuration. For example, the direct electrode 22 and the indirect electrode 23 may be provided integrally by stacking. Hereinafter, for various configurations of the direct electrode 22 and the indirect electrode 23, descriptions will be made on a case of performing the plating processing by way of example.

Figure 25:
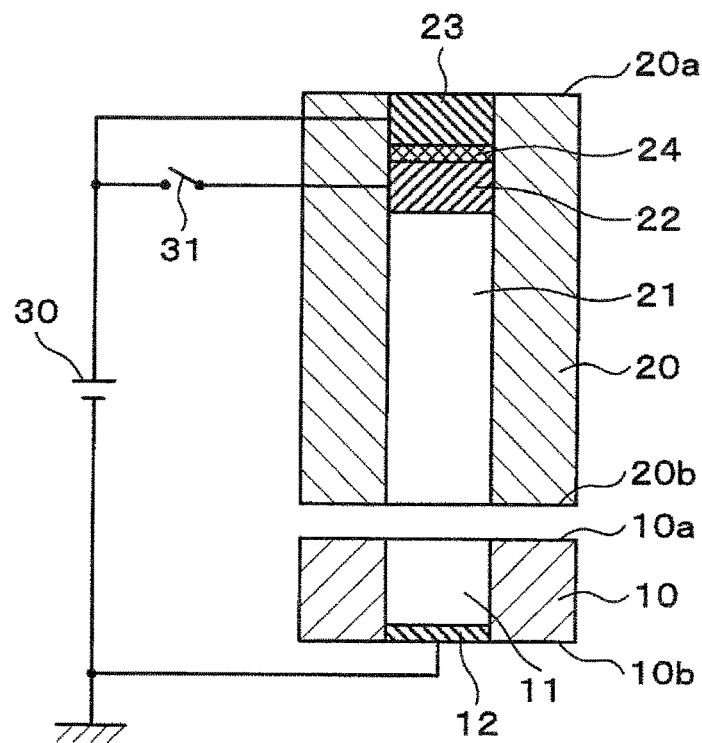
FIG. 25 is a vertical cross-sectional view illustrating a schematic configuration of a template according to another exemplary embodiment.

For example, as illustrated in FIG. 25, the direct electrode 22, the insulating material 24, and the indirect electrode 23 may be stacked. The direct electrode 22, the insulating material 24, and the indirect electrode 23 are provided inside the passage 21, and are stacked in this order from the counter electrode 12 side.

In this case, since the direct electrode 22 and the indirect electrode 23 are stacked, an electric line of force, which is perpendicular to the direct electrode 22, runs toward the counter electrode 12, and when the copper ions C are caused to migrate to the counter electrode 12 side, the negatively charged particles H are likely to be collected on the direct electrode 12 side. Moreover, since the negatively charged particles H are collected on the direct electrode 22, when the copper ions C are reduced by the direct electrode 22 and the counter electrode 12, the oxidation reaction of the negatively charged particles H on the direct electrode 22 are facilitated. Accordingly, the copper ions C may be more efficiently reduced.

Figure 26:
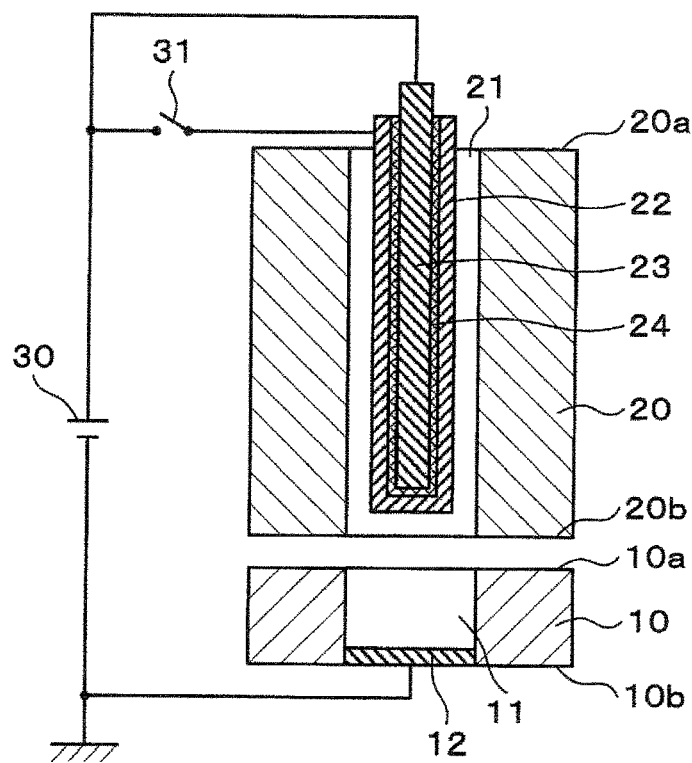
FIG. 26 is a vertical cross-sectional view illustrating a schematic configuration of a template according to another exemplary embodiment.

Meanwhile, as for the arrangement method when stacking the direct electrode 22, the insulating material 24, and the indirect electrode 23, various patterns may be considered. For example, as illustrated in FIG. 26, the direct electrode 22 are immersed inside the passage 21, and the insulating material 24 and the indirect electrode 23 may be provided inside the direct electrode 22. That is, the direct electrode 22 is arranged so as to cover the insulating material 24 and the indirect electrode 23. In this case, since the surface area of the indirect electrode 23 is increased, the negatively charged particles H may be more efficiently collected on the surface of the direct electrode 22, and the copper ions C may be efficiently caused to migrate to the counter electrode 12 side as well.

Figure 27:
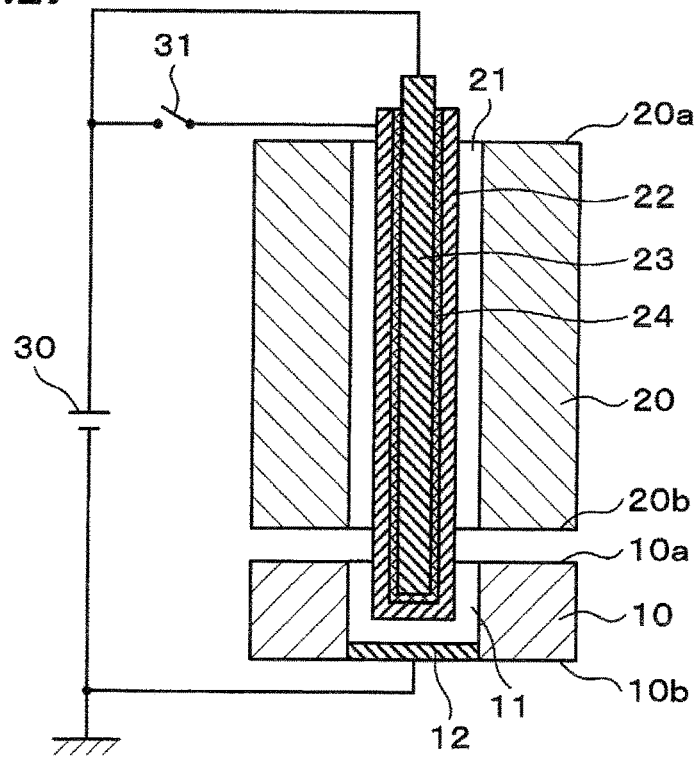
FIG. 27 is a vertical cross-sectional view illustrating a schematic configuration of a template according to another exemplary embodiment.

Further, for example, as illustrated in FIG. 27, in a state where the direct electrode 22, the insulating material 24, and the indirect electrode 23 are stacked, and the insulating material 24 and the indirect electrode 23 are arranged inside the direct electrode 22 (arrangement illustrated in FIG. 26 as described above), the lower end of the direct electrode 22 may extend to the inside of the through-hole 11 of the wafer 10. Even in this case, the negatively charged particles H may be more efficiently collected on the surface of the direct electrode 22, and the copper ions C may be efficiently caused to migrate to the counter electrode 12 side. In this case, the assembly of the electrodes may be moved up and down in accordance with the progress of the processing. Particularly, when performing an etching, if the assembly of the electrodes is moved down as a hole goes underway, the processing may be efficiently performed.

Meanwhile, in the examples illustrated in FIGS. 26 and 27, the diameter of the passage 21 of the template 20 may be larger than the diameter of the through-hole 11 of the wafer 10.

Figure 28:
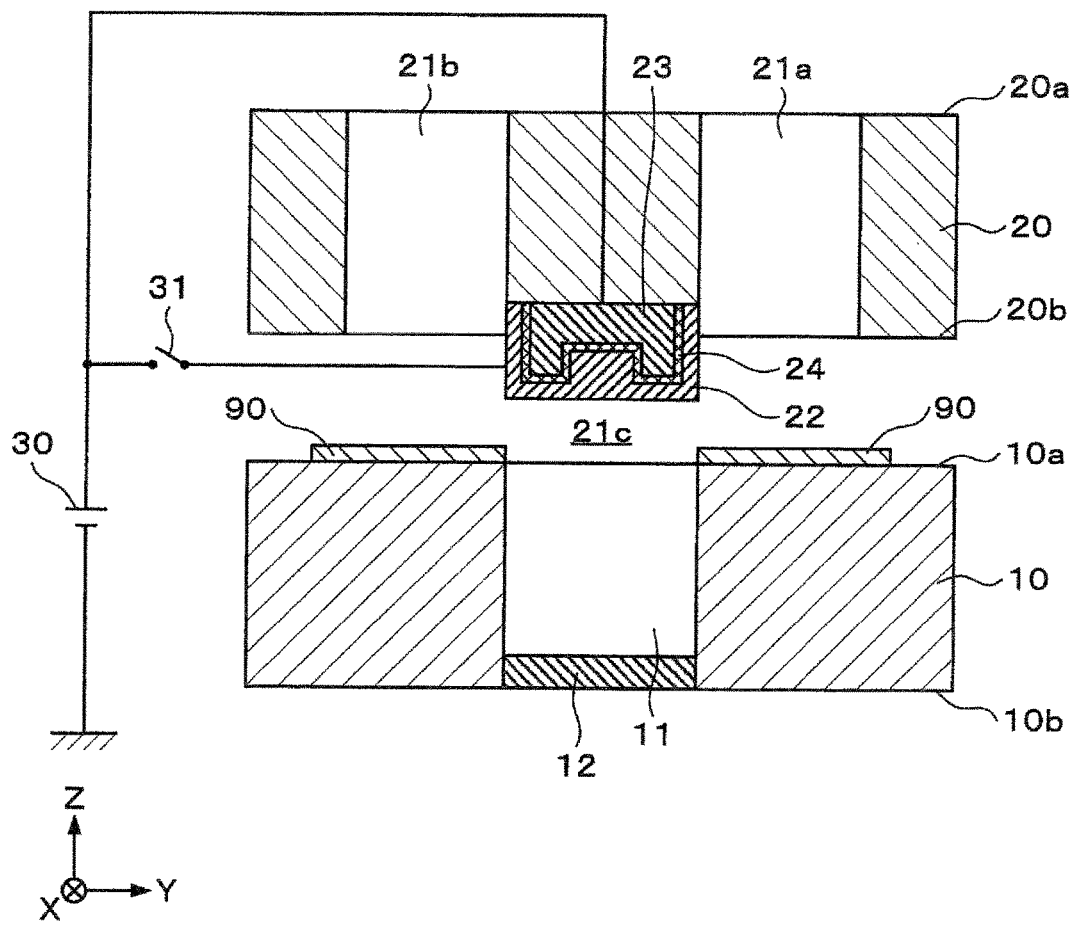
FIG. 28 is a vertical cross-sectional view illustrating a schematic configuration of a template according to another exemplary embodiment.
Figure 29:
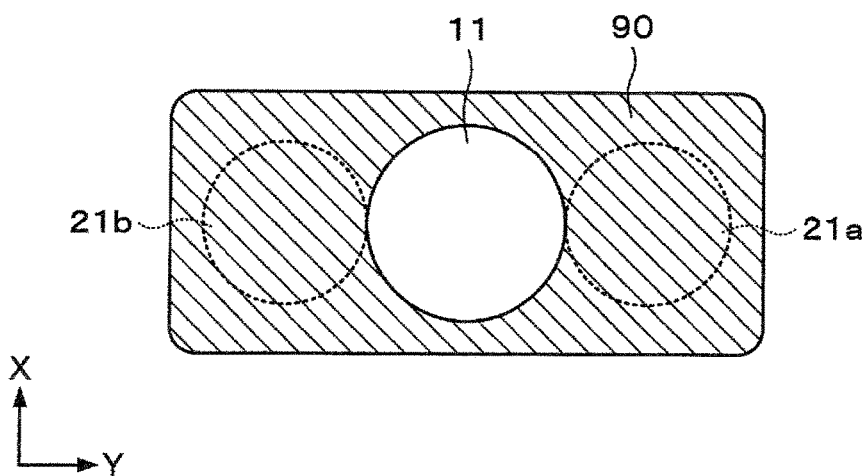
FIG. 29 is a plan view illustrating a hydrophilic region on a wafer in another exemplary embodiment.

Here, for example, as illustrated in FIG. 28, the passage 21 of the template 20 may include an injection hole 21a configured to inject the plating liquid M and a discharge hole 21b configured to discharge the plating liquid M. Each of the injection hole 21a and the discharge hole 21b is formed through the template 20 from the front surface 20a to the rear surface 20b in the thickness direction and extends in the thickness direction. Further, the injection hole 21a and the discharge hole 21b are arranged at both sides of the through-hole 11 of the wafer 10 in the horizontal direction (Y direction) in a plan view, as illustrated in FIGS. 28 and 29. Meanwhile, in the following description, in a gap between the template 20 and the wafer 10, a flow path of the plating liquid M between the injection hole 21a and the discharge hole 21b will be referred to as a gap path 21c. That is, the passage 21 is configured with the injection hole 21a, the discharge hole 21b, and the gap path 21c.

Figure 30:
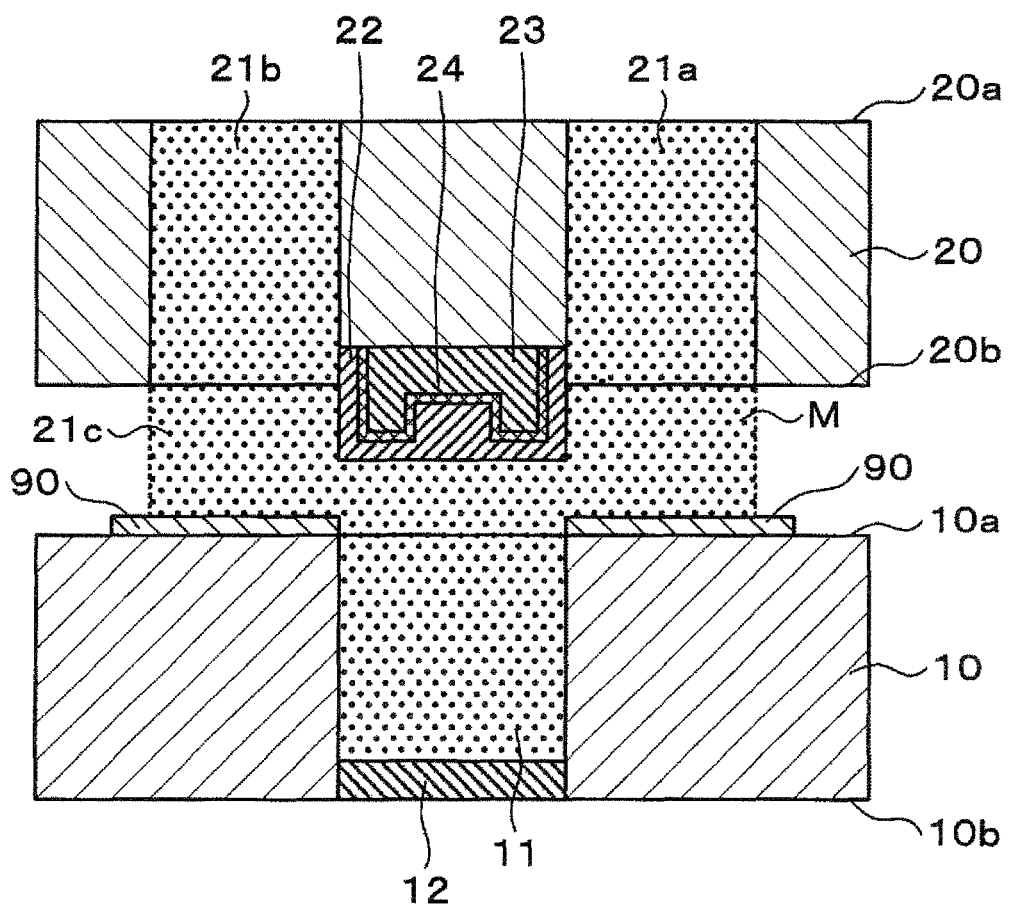
FIG. 30 is an exemplary embodiment illustrating a state where a plating liquid is supplied to a through-hole through a passage and the plating liquid is discharged from the through-hole in another exemplary embodiment.

A hydrophilic region 90 is formed on the front surface of the wafer 10. The hydrophilic region 90 may be easily formed by, for example, a photolithography processing. The hydrophilic region 90 is formed so as to cover at least a periphery of the through-hole 11, the injection hole 21a, and the discharge hole 21b, that is, so as to cover the gap path 21c, in a plan view. Due to the hydrophilic region 90, the plating liquid M present in the gap path 21c is subject to a surface tension in the boundary of the hydrophilic region 90, and thus, never flows to the outside of the hydrophilic region 90. And, as illustrated in FIG. 30, the plating liquid M injected from the injection hole 21a flows into the through-hole 11 through the gap path 21c, and the plating liquid M, which becomes unnecessary, is discharged from the discharge hole 21b through the gap path 21c.

Hereinafter, descriptions will be made on various configurations of the direct electrode 22 and the indirect electrode 23 in the template 20 including the injection hole 21a and the discharge hole 21b formed therein.

For example, as illustrated in FIG. 28, the direct electrode 22, the insulating material 24, and the indirect electrode 23 are provided between the injection hole 21a and the discharge hole 21b. The direct electrode 22, the insulating material 24, and the indirect electrode 23 are arranged above the through hole 11, that is, so as to face the counter electrode 12. Further, direct electrode 22, the insulating material 24, and the indirect electrode 23 are stacked in this order from the counter electrode 12 side. The insulating material 24 and the indirect electrode 23 are arranged inside the direct electrode 22. The insulating material 24 extends in zigzags in a plan view, and the direct electrode 22 and the indirect electrode 23 are provided along the insulating material 24.

Here, in order to cause a number of copper ions C to migrate to the counter electrode 12 side by the indirect electrode 23, it is necessary to increase a capacitance of the indirect electrode 23. In this regard, the present exemplary embodiment is an example using a three-dimensional structure, and the indirect electrode 23 has a large capacitance. Accordingly, the copper ions C may be efficiently caused to migrate to the counter electrode 12 side, and the copper ions C may be efficiently reduced.

Meanwhile, as a method that may be taken in order to increase the capacitance of the indirect electrode 23, methods, such as, for example, increasing the surface area of the indirect electrode 23, increasing a dielectric constant of the insulating material 24, and decreasing the thickness of the insulating material 24 may be mainly considered. Among these, the dielectric constant of the insulating material 24 is determined depending on the material. For example, silicon dioxide ($SiO_2$), silicon nitride (SiN), or aluminum oxynitride (AlON) is used for the insulating material 24. However, a material having a high dielectric constant is selected after considering its workability. Further, there is a limit to decrease the thickness of the insulating material 24. Since the dielectric constant and the thickness of the insulating material 24 are determined in a certain range, it is desirable to increase the surface area of the indirect electrode 23.

Figure 31:
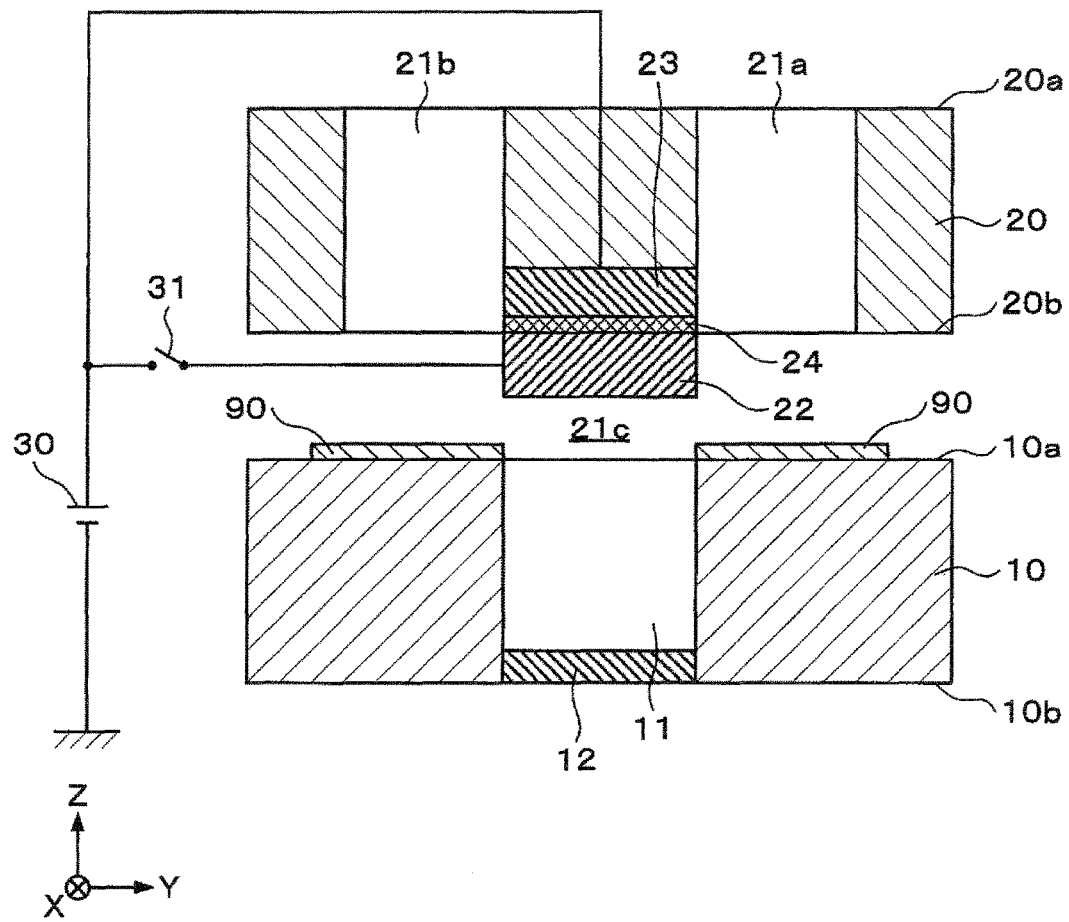
FIG. 31 is a vertical cross-sectional view illustrating a schematic configuration of a template according to another exemplary embodiment.

Thus, the indirect electrode 23 may have a so-called fin structure. For example, as illustrated in FIG. 31, the direct electrode 22, the insulating material 24, and indirect electrode 23 are provided between the injection hole 21a and the discharge hole 21b, and stacked in this order from the counter electrode 12 side. The surface of the direct electrode 22 is exposed to the inside of the flow path of the plating liquid M (the passage 21) between the injection hole 21a and the discharge hole 21b.

Figure 32:
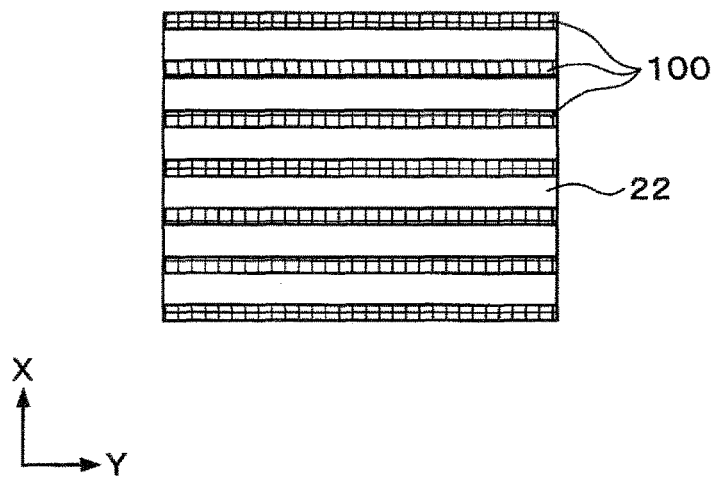
FIG. 32 is a plan view illustrating a schematic configuration of a direct electrode according to another exemplary embodiment.
Figure 33:
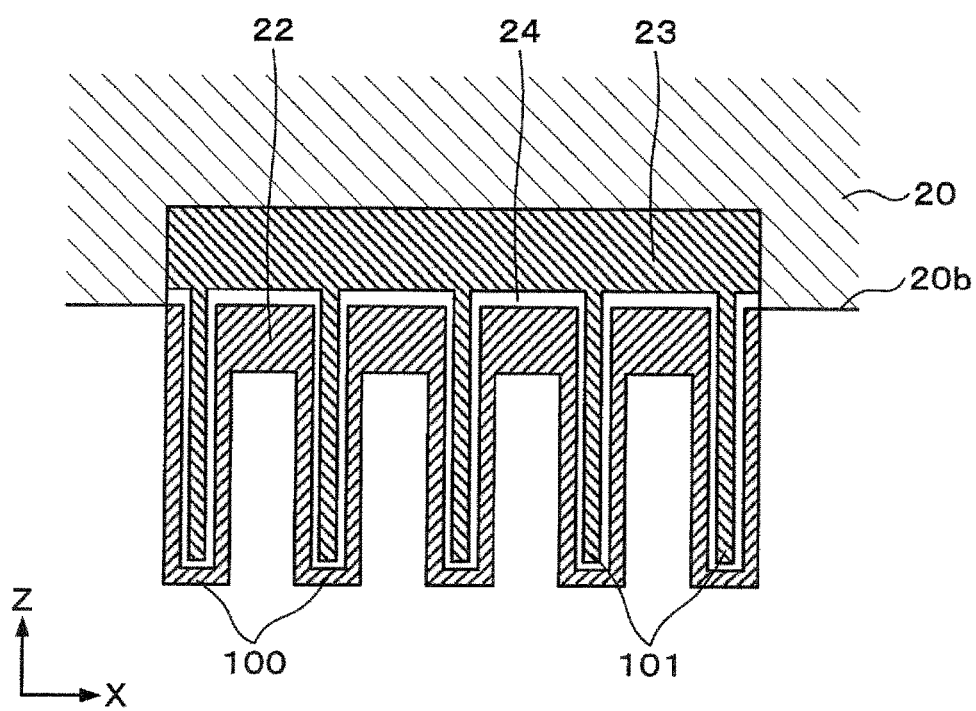
FIG. 33 is a vertical cross-sectional view illustrating a schematic configuration of a direct electrode and an indirect electrode according to another exemplary embodiment.

As illustrated in FIGS. 32 and 33, the direct electrode 22 includes a plurality of first planar fins 100 on its surface. The plurality of first fins 100 extend in parallel in a flow direction of the plating liquid M (Y direction) and are arranged side by side in a direction perpendicular to the flow direction of the plating liquid M (X direction). In addition, the indirect electrode 23 includes a plurality of second planar fins 101 on its surface. Each of the second fins 101 is arranged inside the first fin 100.

In this case, since the indirect electrode 23 includes a plurality of second fins 101, the surface area of the indirect electrode 23 may be increased. Accordingly, the capacitance of the indirect electrode 23 may be increased, and thus, the copper ions C may be more efficiently caused to migrate to the counter electrode 12 side. Therefore, the copper ions C may be more efficiently reduced. In particular, when the through-hole 11 has a very small diameter, it is difficult to secure the surface area of the indirect electrode 23. Therefore, the present exemplary embodiment, which is capable of increasing the surface tension, is very useful.

Figure 34:
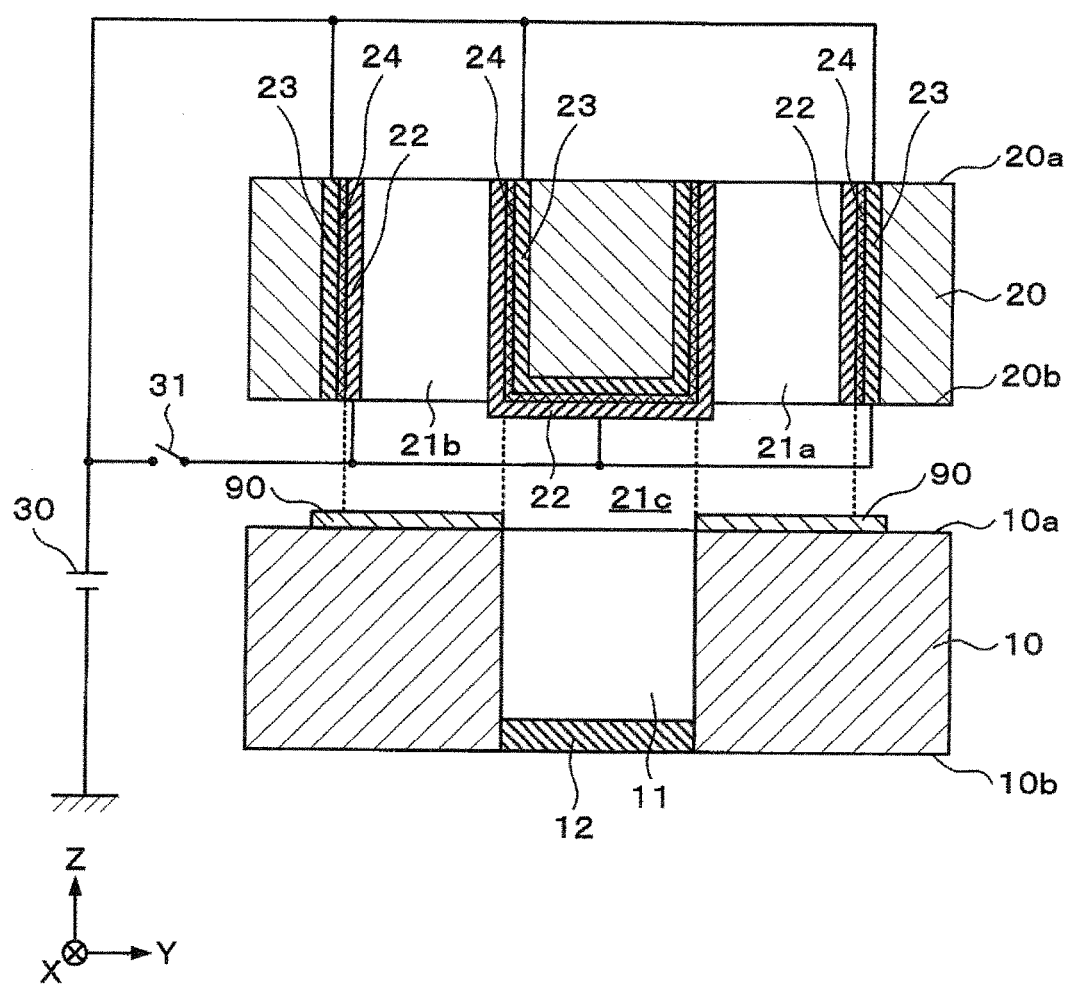
FIG. 34 is a vertical cross-sectional view illustrating a schematic configuration of a template according to another exemplary embodiment.

Further, for example, as illustrated in FIG. 34, the direct electrode 22, the insulating material 24, and the indirect electrode 23 may be provided on the inner surface of the passage 21. The direct electrode 22 is provided so as to be exposed to the inside of the passage 21. The insulating material 24 and the indirect electrode 23 are stacked inside the template 20 in this order from the direct electrode 22 side.

In the passage 21, the direct electrode 22, the insulating material 24, and the indirect electrode 23 are provided in the injection hole 21a and the discharge hole 21b, respectively, to extend along the inner surface thereof. Further, the insulating material 24, and the indirect electrode 23 are provided in the gap path 21c to extend along the inner surface of the gap path 21c above the through-hole 11.

In this case, since the indirect electrode 23 is provided along the inner surfaces of the injection hole 21a, the discharge hole 21b, and the gap path 21c, the surface area of the indirect electrode 23 may be increased. Accordingly, the capacitance of the indirect electrode 23 may be increased, and thus, the copper ions C may be more efficiently caused to migrate to the counter electrode 12 side. Therefore, the copper ions C may be more efficiently reduced.

Meanwhile, in the example of FIG. 34, the direct electrode 22, the insulating material 24, and the indirect electrode 23 are provided on all of the inner surface of the injection hole 21a, the inner surface of the discharge hole 21b, and the inner surface of the gap path 21c, but may be provided only in some of them depending on the required capacitance of the indirect electrode 23.

In the exemplary embodiments described above, descriptions were made on a case of performing the plating processing when the direct electrode 22 and the indirect electrode 23 are stacked, but the present disclosure may be applied to a case of performing the etching processing or the electrodeposited insulating film forming processing as described above.

Figure 35:
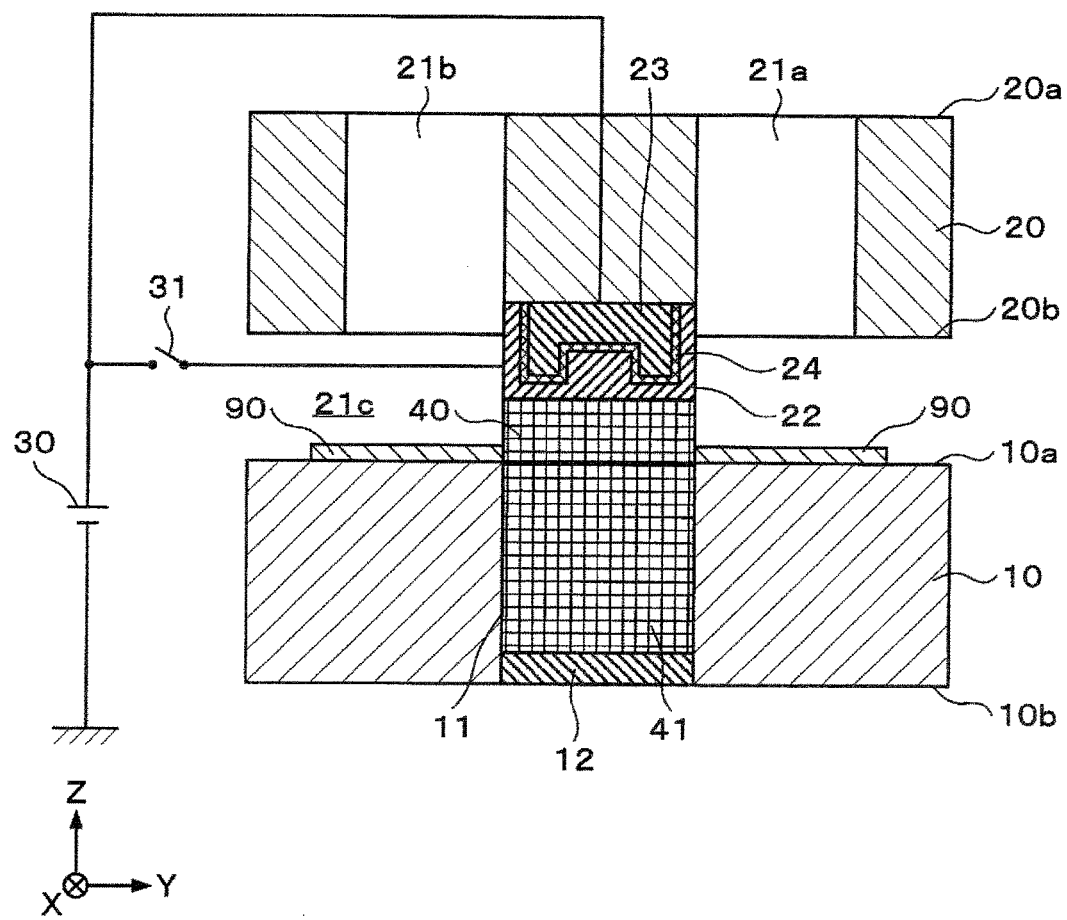
FIG. 35 is an explanatory view illustrating a state where a copper plating is grown on a through silicon via in another exemplary embodiment.
Figure 36:
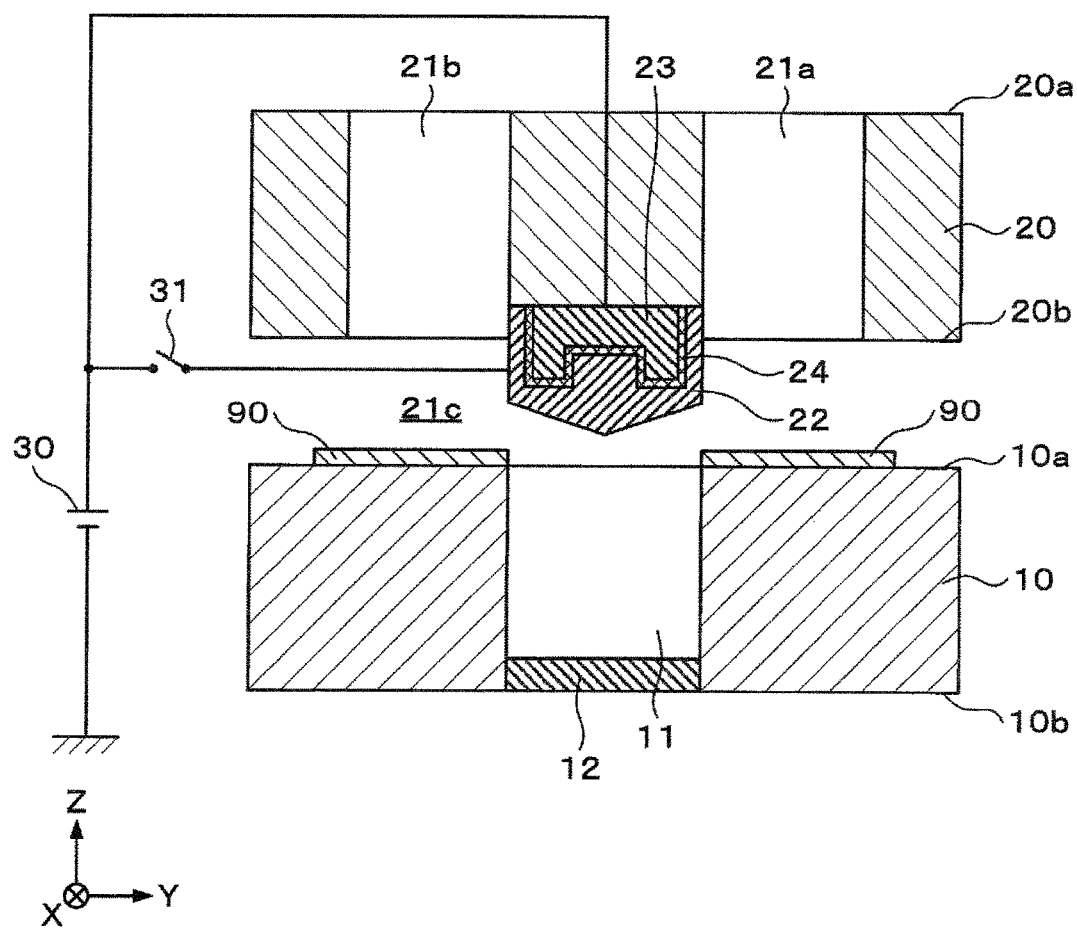
FIG. 36 is a vertical cross-sectional view illustrating a schematic configuration of a template according to another exemplary embodiment.

Further, the present disclosure may also be applied to a case of inspecting electric characteristics of, for example, the through silicon via 41 of the wafer 10 or an electronic circuit of a device layer. For example, after the through silicon via 41 is formed by performing the plating processing in the through-hole 11 as illustrated in FIG. 35, the copper ions C are reduced on the through silicon via 41 and the copper plating 40 is grown on the through silicon via 41. The copper plating 40 is grown until it reaches the direct electrode 22. At this time, for example, by measuring a current value between the direct electrode 22 and the counter electrode 12 and monitoring a change of the current value, it is determined that the copper plating 40 reaches the direct electrode 22. Thereafter, an electric signal is transmitted from the direct electrode 22 to the through silicon via 41 through the cooper plating 40, so that the inspection of the electric characteristics of the through silicon via 41 or the electronic circuit is conducted.

Meanwhile, descriptions were made on the example in which the formation of the through silicon via and the inspection of the electric characteristics are sequentially conducted. However, the present exemplary embodiment may be applied to a case where the template 20 is arranged on a wafer in which the through silicon via is formed in advance, and only the inspection of the electric characteristics of the through silicon via or the electronic circuit are conducted. Similarly to the above-described exemplary embodiment, conduction between the through silicon via and the direct electrode may be obtained by growing the copper plating until it reaches from the through silicon via to the direct electrode. In a method of obtaining conduction by pressing a conventional probe against an electrode on a wafer, accurate contact is difficult with progress of miniaturization. However, the contact may be accurately obtained in the present exemplary embodiment.

In the exemplary embodiment described above, when the direct electrode 22 is provided to face the counter electrode 12, the central portion of the surface of the direct electrode 22 at the counter electrode 12 side may protrude. For example, in the example where the direct electrode 22, the insulating material 24, and the indirect electrode 23 are stacked above the through-hole 11 as illustrated in FIG. 28, the central portion of the surface of the direct electrode 22 protrudes as illustrated in 35. In the illustrated example, the tip end portion of the direct electrode 22 protrudes in a conical shape.

Then, when the plating processing is performed, the copper plating 40 is grown from the central portion in the through-hole 11, so that the through silicon via 41 is formed. Even in this case, it is possible to enjoy the same effect as in the above-described exemplary embodiment. That is, the plating processing may be efficiently performed in a short time. In addition, the plating processing may be uniformly performed.

Further, in a case where the electric characteristics of the through silicon via 41 or the electric circuit are inspected, when the copper plating 40 is grown on the through silicon via 41, the central portion of the direct electrode 22 becomes the closest anode from the through-hole 11. Thus, the copper plating 40 is preferentially grown on the central portion of the direct electrode 22 and the electric line of force of the through-hole 11. Then, the through silicon via 41 and the direct electrode 22 are connected only in their central portion by the copper plating 40. In such a case, since a small amount of the copper plating 40 is sufficient to be grown, the plating processing may be performed in a short time to grow the copper plating 40. Accordingly, the inspection of the electric characteristics of the through silicon via 41 or the electric circuit may be more efficiently performed.

Meanwhile, in the exemplary embodiment described above, the central portion of the surface of the direct electrode 22 protrudes while the tip end portion of the direct electrode 22 is formed in a conical shape. However, the surface of the direct electrode 22 may be flat, and a separate protruding portion may be provided in the central portion of the surface. Further, the above-described exemplary embodiment was described with reference to the example illustrated in FIG. 28. However, in the example illustrated in FIG. 31 or 34, the central portion of the surface of the direct electrode 22 may also protrude.

Figure 37:
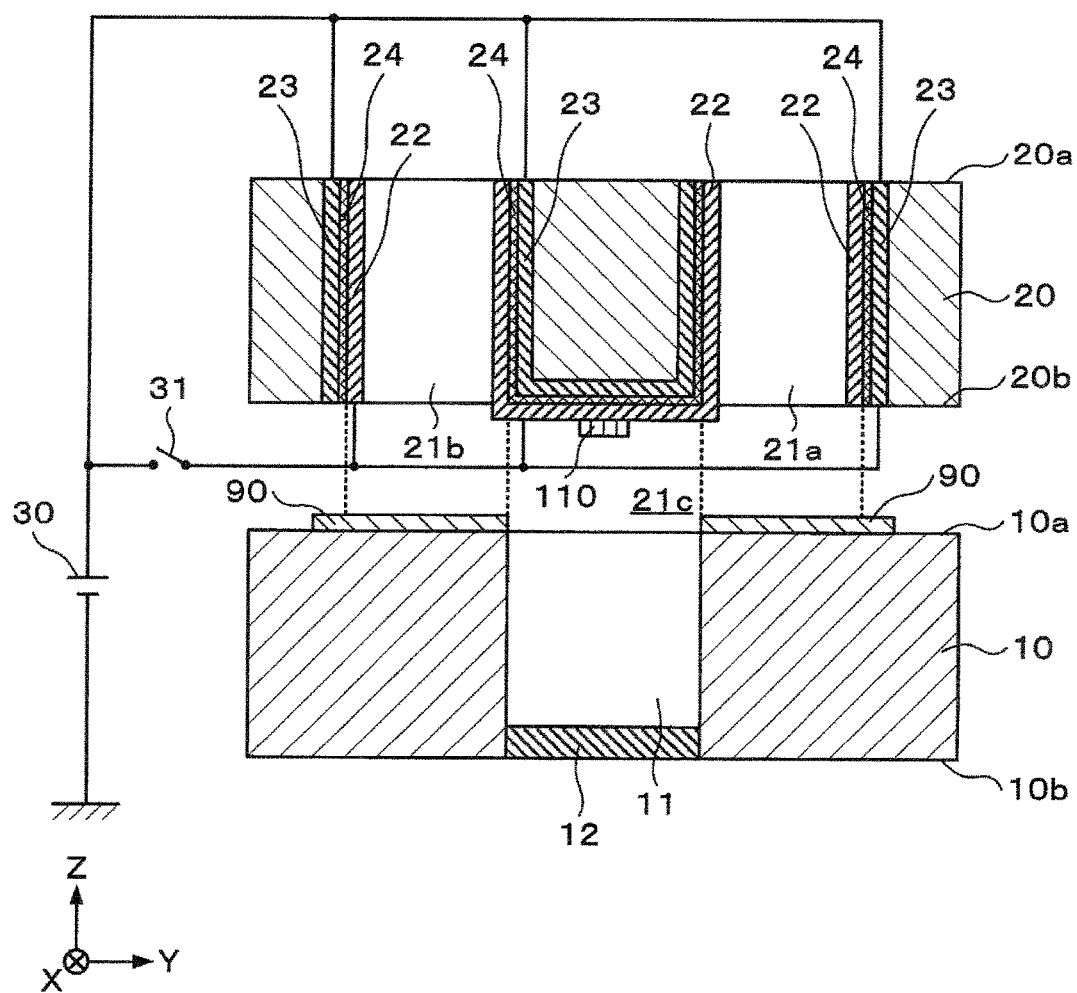
FIG. 37 is a vertical cross-sectional view illustrating a schematic configuration of a template according to another exemplary embodiment.

In the exemplary embodiments described above, the electric characteristics of the through silicon via 41 or the electric circuit were inspected using the direct electrode 22. However, a contact electrode, which is separate from the direct electrode 22, may be used. For example, in the example where the direct electrode 22, the insulating material 24, and the indirect electrode 23 are stacked above the through-hole 11 as illustrated in FIG. 34, a contact electrode 110 protrudes from the central portion of the surface of the direct electrode 22 at the counter electrode 12 side, as illustrated in FIG. 37. In other words, the contact electrode 110 is arranged above the central portion of the through-hole 11. Meanwhile, in the surface of the direct electrode 22, any other electrode is not formed around the contact electrode 110.

In this case, when the through-hole 41 is formed by growing the copper plating 40 in the through-hole 11, the contact electrode 110 functions as an anode, like the direct electrode 22.

Thereafter, in order to inspect the electric characteristics of the through silicon via 41 or the electric circuit, when the copper plating 40 is further grown on the through silicon via 41, only the contact electrode functions as a positive pole. With respect to the direct electrode 22, the function as a positive pole is stopped. However, in order to avoid becoming a negative pole, the direct electrode 22 is brought into a floating state. Then, since the contact electrode 110 becomes the closest positive pole from the through silicon via 41, the copper plating 40 is preferentially grown on the contact electrode 110 and the electric line of force of the through-hole 11. Then, the through silicon via 41 and the direct electrode 22 are connected only in their central portion by the copper plating 40. In such a case, since a small amount of the copper plating 40 is sufficient to be grown, the plating processing may be performed in a short time to grow the copper plating 40. Accordingly, the inspection of the electric characteristics of the through silicon via 41 or the electric circuit may be more efficiently performed.

Meanwhile, the above-described exemplary embodiment was described with reference to the example illustrated in FIG. 34. However, in the example illustrated in FIG. 28 or 31, the contact electrode 110 may also be provided in the central portion of the surface of the direct electrode 22.

From the foregoing, preferred embodiments of the present disclosure were described with reference to the accompanying drawings, but the present disclosure is not limited thereto. It will be appreciated by those skilled in the art that various modifications may be made within the scope of the spirit described in the following claims of the present disclosure. Accordingly, it is understood that their equivalents belong to the technical scope of the present disclosure. The present disclosure is not limited to the exemplary embodiments, and may employ various embodiments.

DESCRIPTION OF SYMBOL

- 10: wafer
- 11: through-hole
- 12: counter electrode
- 20: template
- 21: passage
- 21a: injection hole
- 21b: discharge hole
- 21c: gap path
- 22: direct electrode
- 23: indirect electrode
- 24: insulating material
- 30: DC power source
- 31: switch
- 40: copper plating
- 41: through silicon via
- 50: monitor electrode
- 51: controller
- 60: second indirect electrode
- 61: insulating material
- 70: second indirect electrode
- 71: insulating material
- 80: electrodeposited insulating film
- 90: hydrophilic region
- 100: first fin
- 101: second fin
- 110: contact electrode
- C: copper ion
- D: electrodeposited insulating film solution
- E: etching liquid
- H: charged particle
- M: plating liquid
- N: processing target ion
- P: processing target ion

What is claimed is:

1. A substrate processing method of performing a predetermined processing on a processing region of a substrate, the method comprising:
   providing a template comprising:
      a template body configured to face the processing region of the substrate;
      a passage formed in the template body and configured to distribute a processing liquid to the processing region of the substrate, the passage including a surface which defines the passage;
      a first insulating material provided either on the surface of the passage or within the passage;
      a first indirect electrode to which a first voltage from a power source connected between the first indirect electrode and a counter electrode that is provided in the processing region of the substrate is applied in order to cause processing target ions included in the processing liquid to migrate to the counter electrode, wherein the first indirect electrode is disposed on the first insulating material such that the first insulating material covers the first indirect electrode and the first indirect electrode does not come into contact with the processing liquid flowing through the passage; and
      a direct electrode connected to the counter electrode through the power source, and to which the first voltage from the power source is applied in order to cause the processing target ions that have migrated to the counter electrode to be oxidized or reduced, wherein the direct electrode is provided on the surface of the passage above the first insulating material and the first indirect electrode or provided on the first insulating material within the passage,
   arranging the template to face the substrate;
   supplying the processing liquid to the processing region through the passage;
   applying the first voltage from the power source to the first indirect electrode in order to cause the processing target ions to migrate to the counter electrode; and
   applying the first voltage from the power source to the direct electrode in order to cause the processing target ions that have migrated to the counter electrode to be oxidized or reduced.

2. The substrate processing method of claim 1, wherein the passage is formed to extend in a thickness direction of the template and through the template.

3. The substrate processing method of claim 2, wherein the applying the first voltage to the direct electrode is terminated when the processing liquid in the passage is positioned at a height which is not in contact with the direct electrode.

4. The substrate processing method of claim 1, wherein the template includes a second indirect electrode disposed on a second insulating material which is provided on the surface of the passage below the first insulating material, and the second indirect electrode has a polarity different from that of the indirect electrode, and
   the applying the first voltage to the first indirect electrode includes applying a second voltage to the second indirect electrode.

5. The substrate processing method of claim 1, wherein the substrate includes a second indirect electrode disposed on a second insulating material which is provided on the surface of the passage below the first insulating material within the substrate, and the second indirect electrode has a polarity different from that of the indirect electrode, and the applying the first voltage to the first indirect electrode includes applying a second voltage to the second indirect electrode.

6. The substrate processing method of claim 1, wherein the first indirect electrode is stacked on the direct electrode via the first insulating material within the passage.

7. The substrate processing method of claim 6, wherein a surface of the direct electrode is exposed to the inside of the passage, the direct electrode includes a plurality of first planar fins which are arranged in parallel on the surface, and the first indirect electrode includes a plurality of second planar fins, each of which is arranged inside the first fin.

8. The substrate processing method of claim 6, wherein the direct electrode is provided within the passage, and the first insulating material and the first indirect electrode are provided within the direct electrode.

9. The substrate processing method of claim 6, wherein the indirect electrode, the first insulating material and the direct electrode are stacked in sequence inside of the passage, with at least part of the first indirect electrode above the first insulating material and at least part of the first insulating material above the direct electrode.

10. The substrate processing method of claim 6, wherein a bottom portion of the direct electrode is provided facing the counter electrode, and a central portion of the bottom portion of the counter electrode protrudes in an upper direction.

11. The substrate processing method of claim 6, wherein the passage includes an injection hole configured to inject the processing liquid and a discharge hole configured to discharge the processing liquid, and the direct electrode, the first insulating material, and the first indirect electrode are provided between the injection hole and the discharge hole.

12. The substrate processing method of claim 6, wherein a bottom portion of the direct electrode is provided facing the counter electrode, and a contact electrode, which is different from the direct electrode, is provided on the bottom portion of the direct electrode to protrude toward the counter electrode provided in the processing region of the substrate.

13. The substrate processing method of claim 1, wherein a DC voltage is continuously applied to the first indirect electrode in the applying the first voltage to the first indirect electrode, and a pulse voltage is applied to the direct electrode in the applying the first voltage to the direct electrode.

14. The substrate processing method of claim 1, wherein the template includes a monitor electrode that is provided on the surface of the passage below the first insulating material and the first indirect electrode, and configured to inspect a predetermined processing state, and in the applying the first voltage to the first indirect electrode and the applying the first voltage to the direct electrode, a current value of a current flowing between the counter electrode and the monitor electrode is measured, and the processing state is inspected by a change of the measured current value.

15. A template for use in performing a predetermined processing on a processing region of a substrate, the template comprising:

a template body configured to face the processing region of the substrate;

a passage formed in the template body and configured to distribute a processing liquid to the processing region of the substrate, the passage including a surface which defines the passage;

a first insulating material provided either on the surface of the passage or within the passage;

a first indirect electrode to which a first voltage from a power source connected between the first indirect electrode and a counter electrode that is provided in the processing region of the substrate is applied in order to cause processing target ions included in the processing liquid to migrate to the counter electrode, wherein the first indirect electrode is disposed on the first insulating material such that the first insulating material covers the first indirect electrode and the first indirect electrode does not come into contact with the processing liquid flowing through the passage; and a direct electrode connected to the counter electrode through the power source, and to which the first voltage from the power source is applied in order to cause the processing target ions that have migrated to the counter electrode to be oxidized or reduced, wherein the direct electrode is provided on the surface of the passage above the first insulating material and the first indirect electrode or provided on the first insulating material within the passage.

16. The template of claim 15, wherein the passage is formed to extend in a thickness direction of the template and through the template.

17. The template of claim 16, wherein the direct electrode is arranged at the same height as the top surface of the processing liquid remaining in the passage at the end of the predetermined processing.

18. The template of claim 16, wherein the direct electrode and the first indirect electrode are arranged side by side in a vertical direction.

19. The template of claim 16, wherein the direct electrode and the first indirect electrode are arranged side by side in a horizontal direction.

20. The template of claim 16, wherein a plurality of the direct electrodes and a plurality of the indirect electrodes are provided.

21. The template of claim 16, wherein the first indirect electrode extends to a lower end of the template along the passage.

22. The template of claim 15, further comprising:

a second indirect electrode disposed on a second insulating material which is provided on the surface of the passage below the first insulating material, wherein the second indirect electrode has a polarity different from a polarity of the first indirect electrode.

23. The template of claim 15, wherein the first indirect electrode is stacked on the direct electrode via the first insulating material within the passage.

24. The template of claim 23, wherein a surface of the direct electrode is exposed to the inside of the passage, the direct electrode includes a plurality of first planar fins which are arranged in parallel on the surface, and the first indirect electrode includes a plurality of second planar fins, each of which is arranged inside the first fin.

25. The template of claim 23, wherein the direct electrode is provided within the passage, and the first insulating material and the first indirect electrode are provided within the direct electrode.

26. The template of claim 23, wherein the first indirect electrode, the first insulating material and the direct electrode are stacked in sequence inside of the passage, with at least part of the first indirect electrode above the first insulating material and at least part of the first insulating material above the direct electrode.

27. The template of claim 23, wherein a bottom portion of the direct electrode is provided facing the counter electrode, and
   a central portion of the bottom portion of the direct electrode protrudes in an upward direction.

28. The template of claim 23, wherein the passage includes an injection hole configured to inject the processing liquid and a discharge hole configured to discharge the processing liquid, and
   the direct electrode, the first insulating material, and the first indirect electrode are provided between the injection hole and the discharge hole.

29. The template of claim 23, wherein a bottom portion of the direct electrode is provided facing the counter electrode, and
   a contact electrode, which is different from the direct electrode, is provided on the bottom portion of the direct electrode to protrude toward the counter electrode provided in the processing region of the substrate.

30. The template of claim 15, wherein the first voltage applied to the first indirect electrode is a DC voltage that is continuously applied thereto, and
   the first voltage applied to the direct electrode is a pulse voltage.

31. The template of claim 15, further comprising a monitor electrode that is provided on the surface of the passage below the first insulating material and the first indirect electrode, and configured to inspect a predetermined processing state by a change of a current value of a current flowing between the counter electrode and the monitor electrode.

32. The template of claim 15, wherein the direct electrode, the first indirect electrode and the counter electrode are each connected to the power source that is a DC power source,
   the counter electrode is connected to a negative electrode of the power source, and the direct electrode and the first indirect electrode are each connected to a positive electrode of the power source, and
   a switch is provided between the direct electrode and the power source to switch a connection state of the direct electrode and the power source.

* * * * *